US011201210B2

(12) United States Patent
Kyogoku et al.

(10) Patent No.: US 11,201,210 B2
(45) Date of Patent: Dec. 14, 2021

(54) SEMICONDUCTOR DEVICE, INVERTER CIRCUIT, DRIVE DEVICE, VEHICLE, AND ELEVATOR

(71) Applicant: KABUSHIKI KAISHA TOSHIBA, Minato-ku (JP)

(72) Inventors: Shinya Kyogoku, Tsukuba (JP); Katsuhisa Tanaka, Tsukuba (JP); Ryosuke Iijima, Setagaya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/797,022

(22) Filed: Feb. 21, 2020

(65) Prior Publication Data

US 2021/0036102 A1 Feb. 4, 2021

(30) Foreign Application Priority Data

Aug. 2, 2019 (JP) ............................ JP2019-143402

(51) Int. Cl.
*H01L 29/06* (2006.01)
*H01L 29/16* (2006.01)
(Continued)

(52) U.S. Cl.
CPC .......... *H01L 29/063* (2013.01); *H01L 21/049* (2013.01); *H01L 21/0465* (2013.01); *H01L 21/0475* (2013.01); *H01L 29/0869* (2013.01); *H01L 29/1095* (2013.01); *H01L 29/1608* (2013.01); *H01L 29/66068* (2013.01);
(Continued)

(58) Field of Classification Search
CPC ....... H01L 33/22; H01L 33/20; H01L 33/005; H01L 2933/0083; H01L 2933/0091; H01L 29/4236; H01L 29/42352; H01L 29/66613–66628; H01L 29/42356; H01L 29/0696; H01L 29/1095; H01L 29/7375;
(Continued)

(56) References Cited

U.S. PATENT DOCUMENTS

2013/0306983 A1* 11/2013 Nakano .............. H01L 29/0696 257/76
2017/0117352 A1 4/2017 Esteve et al.
2018/0076316 A1 3/2018 Kinoshita

FOREIGN PATENT DOCUMENTS

JP 2001-267570 A 9/2001
JP 6090805 B2 3/2017
(Continued)

*Primary Examiner* — Cuong B Nguyen
(74) *Attorney, Agent, or Firm* — Oblon, McClelland, Maier & Neustadt, L.L.P.

(57) ABSTRACT

A semiconductor device of an embodiment includes a SiC layer including a first trench, a second trench having first and second regions, an n-type first SiC region, a p-type second SiC region, an n-type third SiC region, a p-type fourth SiC region between the first trench and the first SiC region, and a p-type fifth SiC region between the second trench and the first SiC region and having a first portion and a second portion, a gate electrode in the first trench, a first electrode in the second trench, and a second electrode. A distance between the first trench and the first region is greater than a distance between the first trench and the second region, the first portion is separated from the fourth SiC region, the second portion contacts the fourth SiC region, the first region contacts the first portion, and the second region contacts the second portion.

13 Claims, 28 Drawing Sheets

AA' CROSS SECTION

SECOND DIRECTION

THIRD DIRECTION

100

12a 20 16 18 12a 20 16 18

12 P1 30 28 C C' 22x p⁺ p⁻ 10 21 32 26 d6 d3 d5 34x 22 d7 34 d4 n⁻ 24 n⁺ P2 14

(51) Int. Cl.

| | |
|---|---|
| ***H01L 29/08*** | (2006.01) |
| ***H01L 29/10*** | (2006.01) |
| ***H01L 29/78*** | (2006.01) |
| ***H01L 21/04*** | (2006.01) |
| ***H01L 29/66*** | (2006.01) |
| *B66B 11/04* | (2006.01) |
| *H02P 27/06* | (2006.01) |
| *B61C 3/00* | (2006.01) |
| *B60R 16/023* | (2006.01) |
| *B60K 1/00* | (2006.01) |

(52) U.S. Cl.
CPC ............ *H01L 29/7813* (2013.01); *B60K 1/00* (2013.01); *B60R 16/0231* (2013.01); *B61C 3/00* (2013.01); *B66B 11/043* (2013.01); *H02P 27/06* (2013.01)

(58) Field of Classification Search
CPC ... H01L 29/7393–7395; H01L 29/7397; H01L 29/66325; H01L 29/66333–66348
See application file for complete search history.

(56) References Cited

FOREIGN PATENT DOCUMENTS

| | | |
|---|---|---|
| JP | 2017-204655 A | 11/2017 |
| JP | 2018-046163 A | 3/2018 |

* cited by examiner

AA' CROSS SECTION
SECOND DIRECTION
THIRD DIRECTION
100
12a
20 16 18
12
P1
30
28
22x
C
C'
21
32
10
26
d6
d3
d5
d7
d4
34x
22
34
n+
p
p+
n−
24
P2
14

BB' CROSS SECTION
SECOND DIRECTION
THIRD DIRECTION
100
12
P1
30
28
C'
26
24
P2
14
20 16 18
12a
22y
34
22
34y
21
32
n+
p+
n−
10
C

100
B'
A'
B
A
n+
18
16
30
12a
22x
22y
21
SECOND DIRECTION
FIRST DIRECTION

CC' CROSS SECTION
100
SECOND DIRECTION
FIRST DIRECTION
A
A'
B
B'
12a
22x
22y
26
32
34x
34y
$n^-$
$p^+$

AA’ CROSS SECTION

SECOND DIRECTION

THIRD DIRECTION

AA' CROSS SECTION
SECOND DIRECTION
THIRD DIRECTION
P1
P2
30
28
26
24
21
22
22x
10
n+
p
n−

BB' CROSS SECTION
SECOND DIRECTION
THIRD DIRECTION
P1
P2
30
28
26
24
21
22
22y
10
n+
p
n-

AA' CROSS SECTION
SECOND DIRECTION
THIRD DIRECTION
Al
Al
Al
50
P1
30
28
26
24
P2
n+
p
p+
32
21
22x
22
n−
n+
10

BB' CROSS SECTION
SECOND DIRECTION
THIRD DIRECTION
50
P1
30
28
26
24
P2
Al
32
21
22y
22
n+
p
p+
n−
10

AA' CROSS SECTION
SECOND DIRECTION
THIRD DIRECTION
52
P1
30
28
26
24
P2
32
21
22x
34
22
34x
Al
p
p+
n+
n−
10

BB' CROSS SECTION
SECOND DIRECTION
THIRD DIRECTION
Al
Al
Al
Al
52
P1
30
28
26
24
P2
n+
p+
32
21
22y
34y
22
34
n−
10

AA' CROSS SECTION
SECOND DIRECTION
THIRD DIRECTION
P1
P2
10
12a
16
18
20
21
22
22x
24
26
28
30
32
34
34x
n+
p
p+
n−

BB' CROSS SECTION
SECOND DIRECTION
THIRD DIRECTION
P1
P2
30
28
26
24
20 16 18
32
21
22y
34
22
34y
n+
p+
n-
10

DD' CROSS SECTION
SECOND DIRECTION
THIRD DIRECTION
200
12
P1
30
28
F'
26
24
P2
14
20 16 18
21
32
12a
22x
34
22
34x
n+
p
p+
n-
10
F

EE' CROSS SECTION
SECOND DIRECTION
THIRD DIRECTION
200
12
P1
30
F'
26
24
P2
14
18
16
20
32
21
22y
20a
34
12a
22
34y
n+
p+
n−
10
F

200
E'
D'
E
D
n+
18
16
30
12a
20a
22x
22y
21
SECOND DIRECTION
FIRST DIRECTION

FF' CROSS SECTION
SECOND DIRECTION
FIRST DIRECTION
200
E
E'
D
D'
32
26
12a
34y
34x
22x
22y
20a
n⁻
p⁺

GG' CROSS SECTION
SECOND DIRECTION
THIRD DIRECTION
300
12
P1
30
28
26
24
P2
14
20 16 18
12a
34
22
34x
32
21
22x
10
I
I'
n+
p
p+
n-

HH' CROSS SECTION
SECOND DIRECTION
THIRD DIRECTION
300
12
P1
30
26
24
P2
14
20 16 18
12a
22y
28
21
32
34
22
34y
n+
p+
p
n−
I
I'
10

300
SECOND DIRECTION
FIRST DIRECTION
H'
G'
H
G
18
16
30
12a
22x
22y
21
n+

II' CROSS SECTION
SECOND DIRECTION
FIRST DIRECTION
300
H'
G'
H
G
32
26
12a
26
32
26
12a
26
32
34y
34x
22x
22y
p+
n−

500
SECOND DIRECTION
FIRST DIRECTION
18 16 18
21
22x
22y
12a
n+

600
18 16 18
18
22x
12a
22y
21
n+
SECOND DIRECTION
FIRST DIRECTION

SEMICONDUCTOR DEVICE, INVERTER CIRCUIT, DRIVE DEVICE, VEHICLE, AND ELEVATOR

CROSS-REFERENCE TO RELATED APPLICATION

This application is based upon and claims the benefit of priority from Japanese Patent Application No. 2019-143402, filed on Aug. 2, 2019, the entire contents of which are incorporated herein by reference.

FIELD

Embodiments described herein relate generally to a semiconductor device, an inverter circuit, a drive device, a vehicle, and an elevator.

BACKGROUND

Silicon carbide (SiC) is expected to be a material for a next-generation semiconductor device. Silicon carbide has excellent physical properties, such as about triple the band gap, about ten times the breakdown field strength, and about triple the thermal conductivity of silicon. By utilizing the physical properties, a semiconductor device that is low loss and capable of operating at high temperature can be implemented.

In order for a vertical metal oxide semiconductor field effect transistor (MOSFET) to have low on-resistance, a trench gate structure in which a gate electrode is provided in a trench is applied. By applying the trench gate structure, a channel area per unit area is increased, and on-resistance is reduced.

In order for a MOSFET having a trench gate structure to achieve low power consumption, it is desired to reduce switching loss.

DETAILED DESCRIPTION

Figure 1:
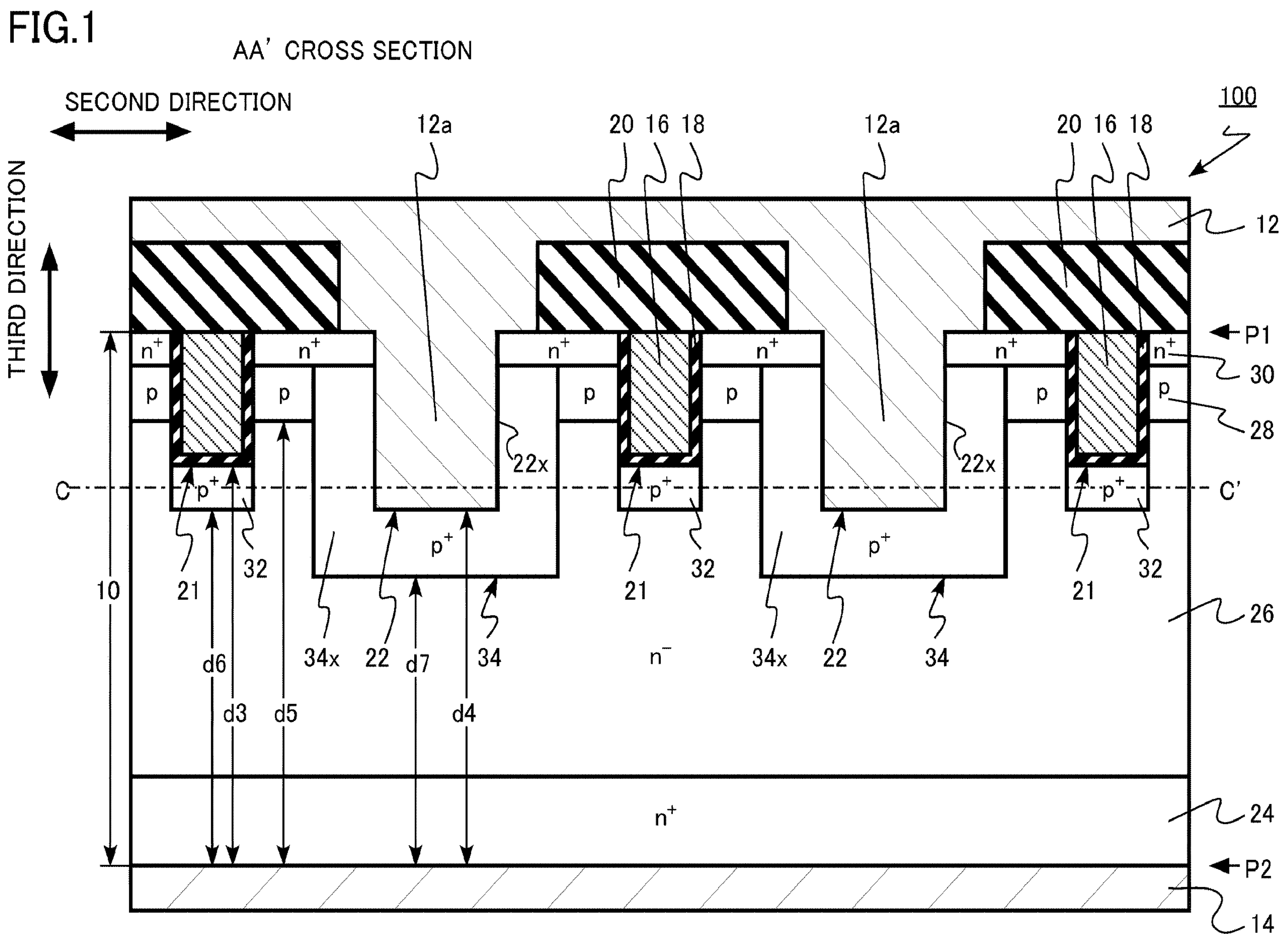
FIG. 1 is a schematic sectional view illustrating a semiconductor device of a first embodiment.

A semiconductor device according to an embodiment includes a silicon carbide layer having a first plane and a second plane facing the first plane, and the silicon carbide layer including: a first trench positioned on a first plane side; a second trench positioned on the first plane side, the second trench having a first region and a second region; a first silicon carbide region of n-type; a second silicon carbide region of p-type positioned between the first silicon carbide region and the first plane; a third silicon carbide region of n-type positioned between the second silicon carbide region and the first plane; a fourth silicon carbide region of p-type positioned between the first trench and the first silicon carbide region, the fourth silicon carbide region having a p-type impurity concentration higher than a p-type impurity concentration of the second silicon carbide region; and a fifth silicon carbide region of p-type positioned between the second trench and the first silicon carbide region, the fifth silicon carbide region having a p-type impurity concentration higher than the p-type impurity concentration of the second silicon carbide region, and the fifth silicon carbide region having a first portion and a second portion, a gate electrode positioned in the first trench; a gate insulating layer positioned between the gate electrode and the silicon carbide layer; a first electrode positioned on the first plane side of the silicon carbide layer, a part of the first electrode being positioned in the second trench; and a second electrode positioned on a second plane side of the silicon carbide layer, wherein a first distance between the first trench and the first region is greater than a second distance between the first trench and the second region, the first portion is separated from the fourth silicon carbide region, and the second portion is in contact with the fourth silicon carbide region, and the first region is in contact with the first portion, and the second region is in contact with the second portion.

Hereinafter, embodiments of the present disclosure will be described with reference to the drawings. Note that, in the following description, the same reference signs are assigned to the same or similar members and the like, and the description of the member that has been described will be appropriately omitted.

In the following description, the notations of $n^+$, n, and $n^-$, and $p^+$, p, and $p^-$ represent relative levels of impurity concentration in each conductive type. That is, $n^+$ has a relatively higher n-type impurity concentration than n, and $n^-$ has a relatively lower n-type impurity concentration than n. Furthermore, $p^+$ has a relatively higher p-type impurity concentration than p, and $p^-$ has a relatively lower p-type impurity concentration than p. Note that, an $n^+$-type and an $n^-$-type will be also simply referred to as an n-type, and a $p^+$-type and a $p^-$-type will be also simply referred to as a p-type.

The impurity concentration can be measured by, for example, the secondary ion mass spectrometry (SIMS). In addition, the relative level of the impurity concentration can be determined from the level of the carrier concentration obtained by, for example, the scanning capacitance microscopy (SCM). The distance, such as the width and depth, of an impurity region can be obtained by the SIMS, for example. Alternatively, the distance, such as the width and depth, of the impurity region can be obtained from, for example, an SCM image.

The depth of a trench, the thickness of an insulating layer, and the like can be measured, for example, on an SIMS or transmission electron microscope (TEM) image.

In this specification, the impurity concentration of a silicon carbide region is represented by, for example, the maximum impurity concentration of the region.

First Embodiment

A semiconductor device according to a first embodiment includes a silicon carbide layer having a first plane and a second plane facing the first plane, and the silicon carbide layer including: a first trench positioned on a first plane side; a second trench positioned on the first plane side, the second trench having a first region and a second region; a first silicon carbide region of n-type; a second silicon carbide region of p-type positioned between the first silicon carbide region and the first plane; a third silicon carbide region of n-type positioned between the second silicon carbide region and the first plane; a fourth silicon carbide region of p-type positioned between the first trench and the first silicon carbide region, the fourth silicon carbide region having a p-type impurity concentration higher than a p-type impurity concentration of the second silicon carbide region; and a fifth silicon carbide region of p-type positioned between the second trench and the first silicon carbide region, the fifth silicon carbide region having a p-type impurity concentration higher than the p-type impurity concentration of the second silicon carbide region, and the fifth silicon carbide region having a first portion and a second portion, a gate electrode positioned in the first trench; a gate insulating layer positioned between the gate electrode and the silicon carbide layer; a first electrode positioned on the first plane side of the silicon carbide layer, a part of the first electrode being positioned in the second trench; and a second electrode positioned on a second plane side of the silicon carbide layer. And a first distance between the first trench and the first region is greater than a second distance between the first trench and the second region, the first portion is separated from the fourth silicon carbide region, and the second portion is in contact with the fourth silicon carbide region, and the first region is in contact with the first portion, and the second region is in contact with the second portion.

The semiconductor device of the first embodiment is a trench-gate-type vertical MOSFET 100 using silicon carbide. The MOSFET 100 is a MOSFET having a trench gate structure in which a gate electrode is provided in a first trench. In addition, the MOSFET 100 is a MOSFET having what is called a double trench structure in which a source electrode is provided in a second trench. The MOSFET 100 is an n-channel MOSFET using electrons as carriers.

Figure 2:
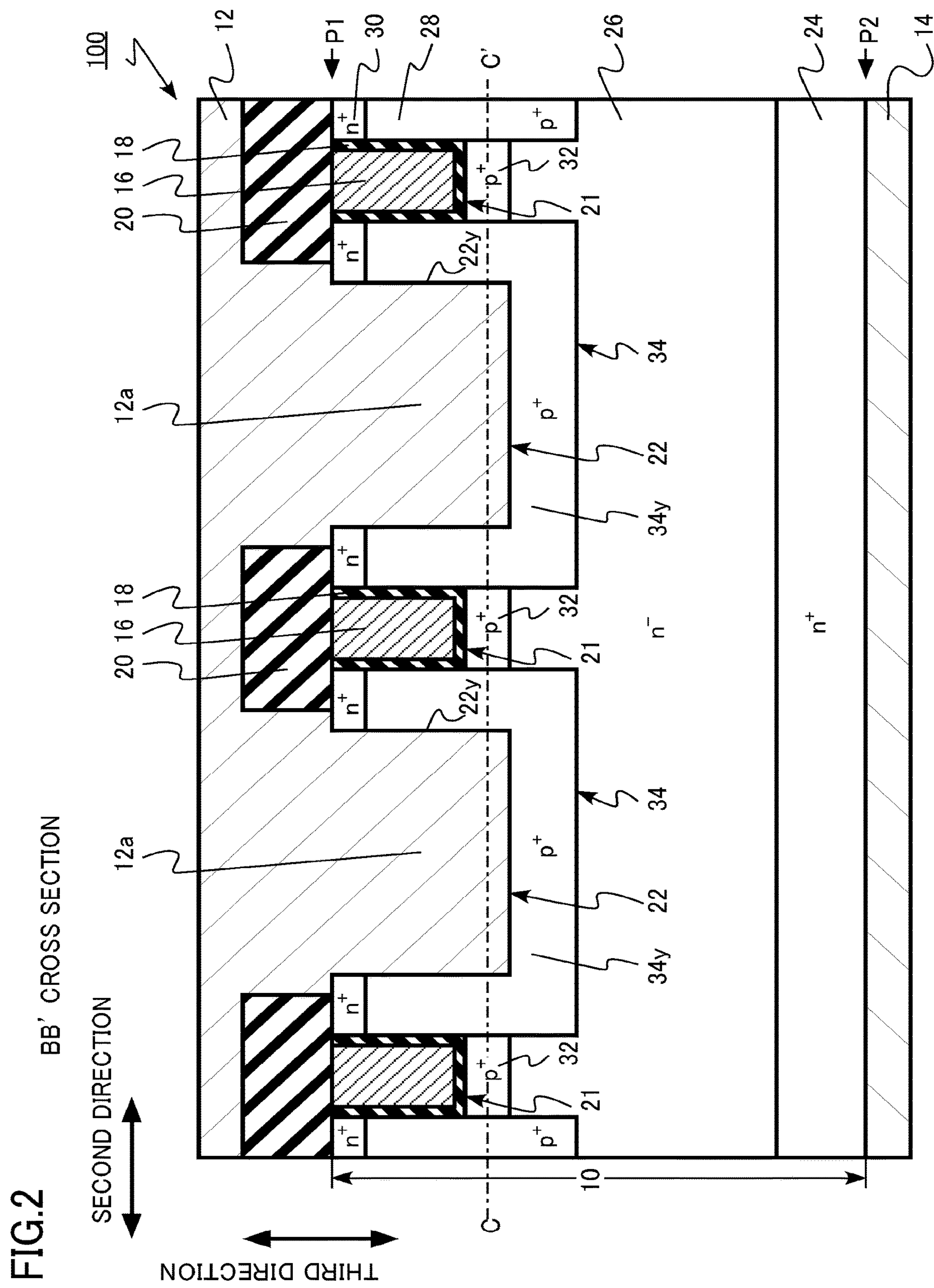
FIG. 2 is a schematic sectional view illustrating the semiconductor device of the first embodiment.
Figure 3:
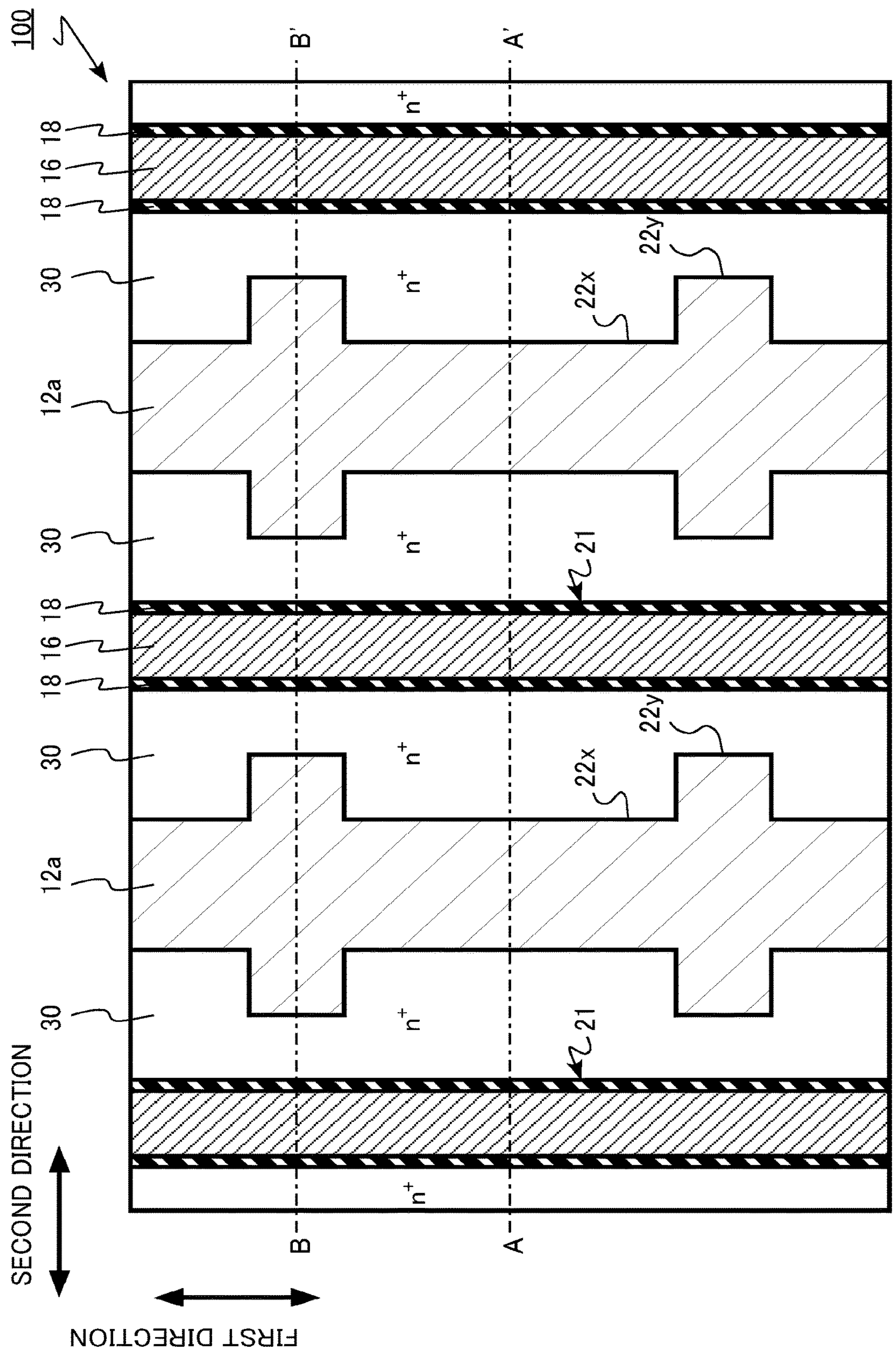
FIG. 3 is a schematic plan view illustrating the semiconductor device of the first embodiment.
Figure 4:
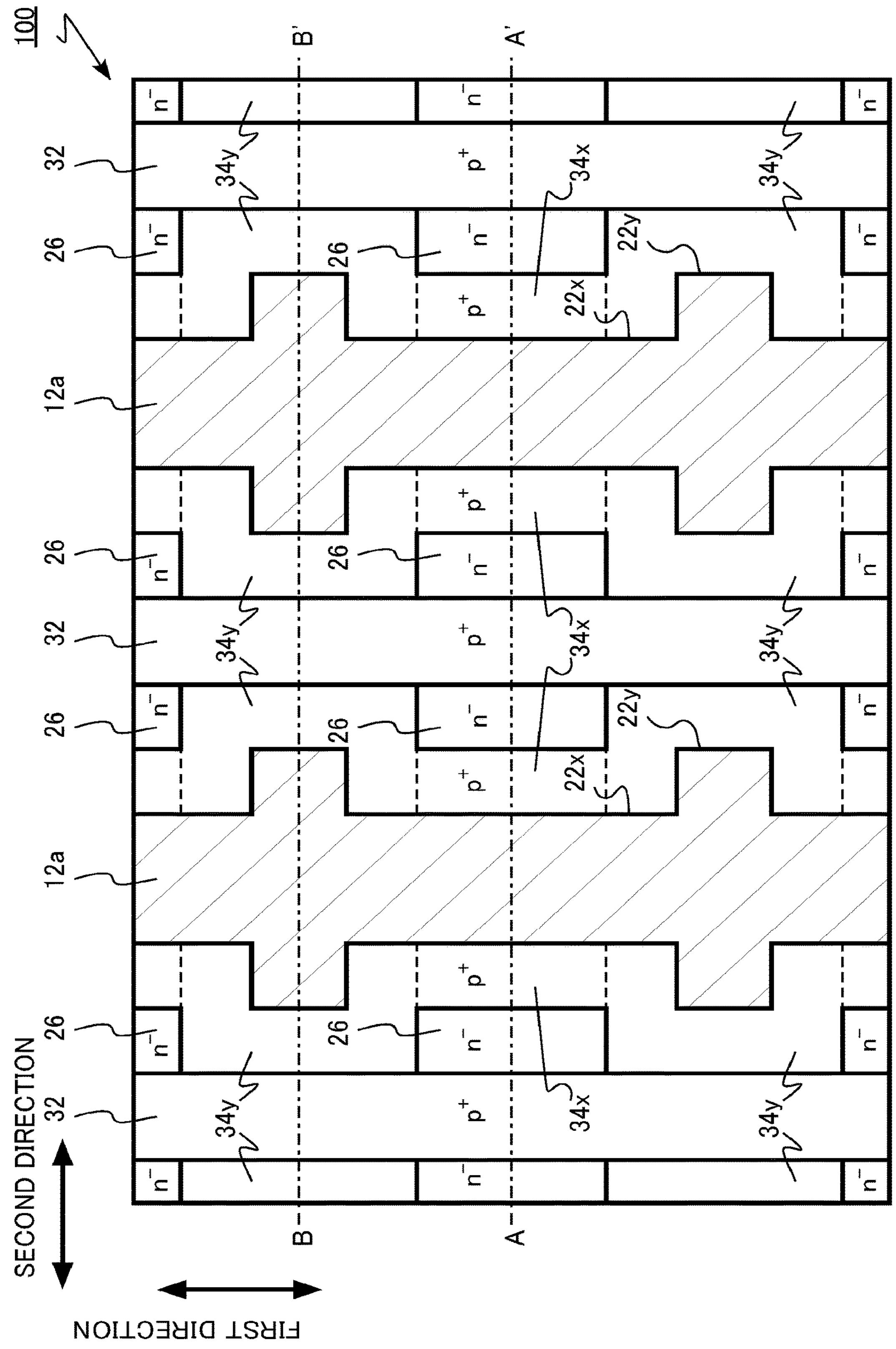
FIG. 4 is a schematic sectional view illustrating the semiconductor device of the first embodiment.

FIG. 1 is a schematic sectional view illustrating the semiconductor device of the first embodiment. FIG. 2 is a schematic sectional view illustrating the semiconductor device of the first embodiment. FIG. 3 is a schematic plan view illustrating the semiconductor device of the first embodiment. FIG. 4 is a schematic sectional view illustrating the semiconductor device of the first embodiment.

FIG. 1 is a cross-sectional view taken along the line AA' of FIG. 3. FIG. 2 is a cross-sectional view taken along the line BB' of FIG. 3. FIG. 4 is a cross-sectional view taken along the line CC' of FIGS. 1 and 2.

The MOSFET 100 includes a silicon carbide layer 10, a source electrode 12 (a first electrode), a drain electrode 14 (a second electrode), a gate electrode 16, a gate insulating layer 18, and an interlayer insulating layer 20.

The silicon carbide layer 10 includes a gate trench (a first trench), a source trench 22 (a second trench), an $n^+$-type drain region 24, an $n^-$-type drift region 26 (a first silicon carbide region), a p-type body region 28 (a second silicon carbide region), an $n^+$-type source region 30 (a third silicon carbide region), a $p^+$-type gate trench bottom region 32 (a fourth silicon carbide region), and a $p^+$-type electric field relaxation region 34 (a fifth silicon carbide region).

The source trench 22 has a first region **22*x* and a second region 22*y*. The electric field relaxation region 34 has a first portion 34*x* and a second portion 34*y*. The source electrode 12 includes a contact region 12*a* (a part) that is a part of the source electrode 12**.

The silicon carbide layer 10 is positioned between the source electrode 12 and the drain electrode 14. The silicon carbide layer 10 includes a first plane ("P1" in FIG. 1) and a second plane ("P2" in FIG. 1). Hereinafter, the first plane P1 is also referred to as a front face, and the second plane P2 is also referred to as a rear face. The second plane P2 faces the first plane P1.

FIG. 3 illustrates a pattern of the MOSFET 100 on the first plane P1.

A first direction and a second direction are parallel to the first plane P1. The second direction intersects the first direction. The second direction is, for example, perpendicular to the first direction. A third direction is perpendicular to the first plane. The third direction is perpendicular to the first direction and the second direction.

Hereinafter, the term "depth" means a depth from the first plane P1.

The silicon carbide layer 10 is single crystal SiC. The silicon carbide layer 10 is, for example, 4H—SiC. The thickness of the silicon carbide layer 10 is, for example, 5 μm or more and 500 μm or less.

The first plane P1 is, for example, inclined from 0 degree or more and 8 degrees or less with respect to a (0001) plane. That is, the first plane P1 is a plane obtained by inclining its normal line from 0 degree or more and 8 degrees or less with respect to a c-axis in a [0001] direction. In other words, the off angle with respect to the (0001) plane is 0 degree or more and 8 degrees or less. The second plane P2 is, for example, inclined from 0 degree or more and 8 degrees or less with respect to a (000-1) plane.

The (0001) plane is called a silicon face. The (000-1) plane is called a carbon face. The inclination direction of the first plane P1 and the second plane P2 is, for example, a [11-20] direction. The [11-20] direction is an a-axis direction. In FIG. 1, the second direction shown in the drawing is the a-axis direction, for example.

Figure 5:
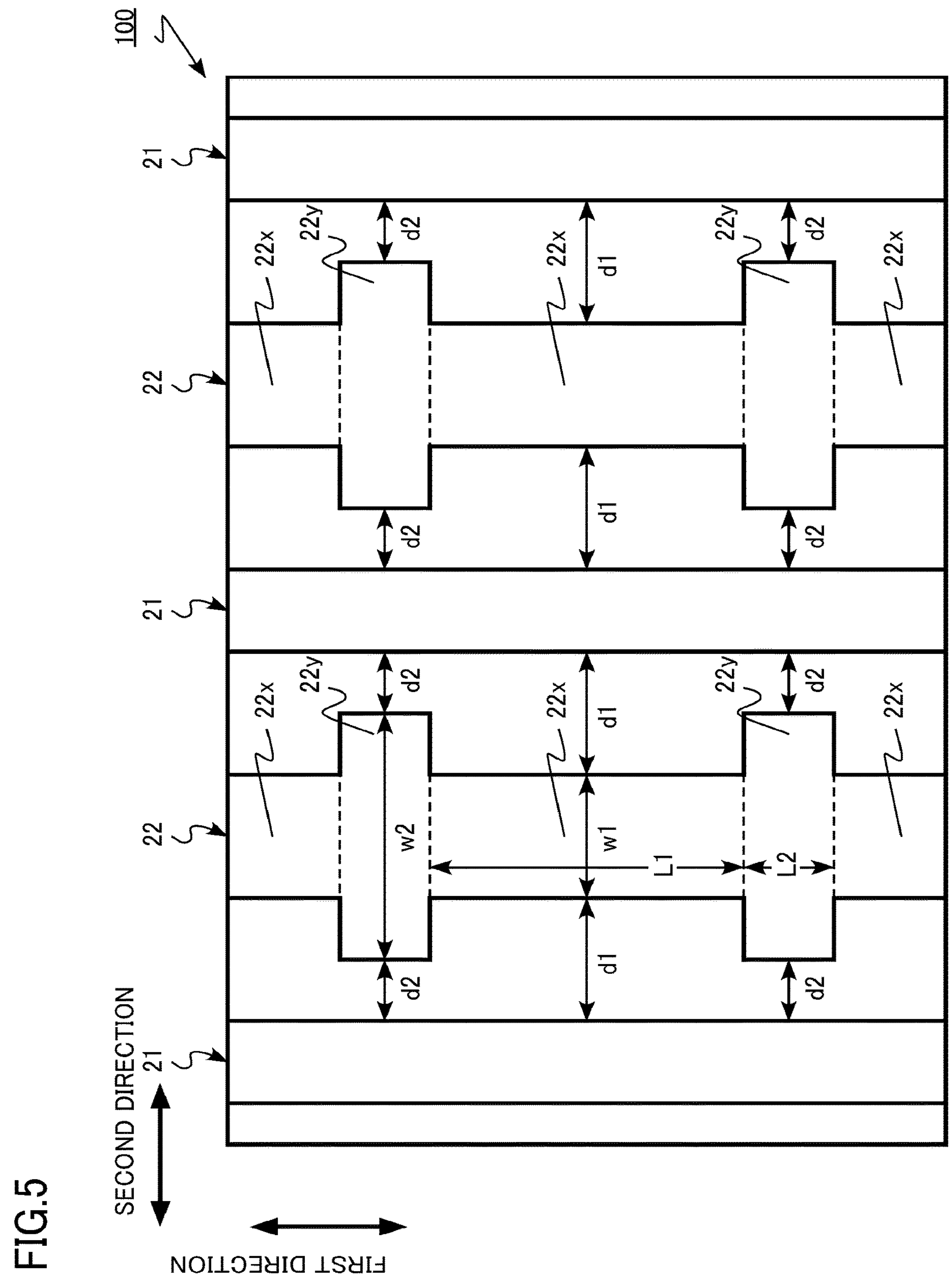
FIG. 5 is a schematic plan view illustrating the semiconductor device of the first embodiment.

FIG. 5 is a schematic plan view illustrating the semiconductor device of the first embodiment. FIG. 5 illustrates the pattern only of the gate trench 21 and the source trench 22 on the first plane P1.

The gate trench 21 is in the silicon carbide layer 10. The gate trench 21 is positioned on the first plane P1 side of the silicon carbide layer 10. The gate trench 21 is a groove formed in the silicon carbide layer 10.

The gate trench 21 extends in the first direction as shown in FIGS. 3 and 5. The gate trench 21 has a stripe shape as shown in FIGS. 3 and 5.

The gate trench 21 is repeatedly disposed in the second direction as shown in FIGS. 3 and 5. The repetition pitch of the gate trench 21 in the second direction is, for example, 1 μm or more and 10 μm or less. The depth of the gate trench 21 is, for example, 1 μm or more and 2 μm or less. The width of the gate trench 21 in the second direction is, for example, 0.5 μm or more and 1 μm or less.

The source trench 22 is in the silicon carbide layer 10. The source trench 22 is positioned on the first plane P1 side of the silicon carbide layer 10. The source trench 22 is a groove formed in the silicon carbide layer 10.

The source trench 22 extends in the first direction as shown in FIGS. 3 and 5. The source trench 22 has a stripe shape as shown in FIGS. 3 and 5. The source trench 22 is sandwiched between the gate trenches 21.

The source trench 22 is repeatedly disposed in the second direction as shown in FIGS. 3 and 5. The repetition pitch of the source trench 22 in the second direction is, for example, 1 μm or more and 10 μm or less. The depth of the source trench 22 is, for example, 1 μm or more and 3 μm or less.

For example, the gate trench 21 and the source trench 22 are alternately positioned in the second direction intersecting the first direction on the first plane P1.

The source trench 22 has a first region 22*x* and a second region 22*y*. The width of the second region 22*y* in the second direction (w2 in FIG. 5) is wider than the width of the first region 22*x* in the second direction (w1 in FIG. 5).

In the pattern of the source trench 22, each side plane of the trench in the second region 22*y* has a portion protruding from the first region 22*x*.

The first region 22*x* and the second region 22*y* are alternately positioned in the first direction. The length of the second region 22*y* in the first direction (L2 in FIG. 5) is shorter than the length of the first region 22*x* in the first direction (L1 in FIG. 5).

A first distance between the gate trench 21 and the first region 22*x* (d1 in FIG. 5) is greater than a second distance between the gate trench 21 and the second region 22*y* (d2 in FIG. 5). The second distance d2 is, for example, ⅓ (one-third) or more and ⅔ (two-thirds) or less of the first distance d1.

For example, the distance between the second plane P2 and the gate trench 21 (d3 in FIG. 1) is greater than the distance between the second plane P2 and the source trench 22 (d4 in FIG. 1). In other words, the depth of the source trench 22 is deeper than the depth of the gate trench 21.

The distance between the second plane P2 and the gate trench 21 (d3 in FIG. 1) is less than the distance between the second plane P2 and the body region 28 (d5 in FIG. 1). In other words, the depth of the gate trench 21 is deeper than the depth of the body region 28.

The distance between the second plane P2 and the source trench 22 (d4 in FIG. 1) is less than the distance between the second plane P2 and the body region 28 (d5 in FIG. 1). In other words, the depth of the source trench 22 is deeper than the depth of the body region 28.

The gate electrode 16 is positioned in the gate trench 21. The gate electrode 16 is provided between the source electrode 12 and the drain electrode 14. The gate electrode 16 extends in the first direction.

The gate electrode 16 is a conductive layer. The gate electrode 16 is, for example, polycrystalline silicon containing a p-type impurity or an n-type impurity.

The gate insulating layer 18 is positioned between the gate electrode 16 and the silicon carbide layer 10. The gate insulating layer 18 is provided between the source region 30 and the gate electrode 16, the body region 28 and the gate electrode 16, and the gate trench bottom region 32 and the gate electrode 16.

The gate insulating layer 18 is, for example, a silicon oxide film. To the gate insulating layer 18, a high-k insulating film (a high dielectric constant insulating film, such as HfSiON, ZrSiON, AlON, or the like) is applicable, for example. Alternatively, a stacked film of a silicon oxide film ($SiO_2$) and a high-k insulating film is also applicable to the gate insulating layer 18, for example.

The interlayer insulating layer 20 is provided on the gate electrode 16. The interlayer insulating layer 20 is provided between the gate electrode 16 and the source electrode 12. The thickness of the interlayer insulating layer 20 is greater than the thickness of the gate insulating layer 18, for example. The interlayer insulating layer 20 is, for example, a silicon oxide film. The interlayer insulating layer 20 electrically separates the gate electrode 16 from the source electrode 12.

The source electrode 12 is positioned on the first plane P1 side of the silicon carbide layer 10. The source electrode 12 is provided on the first plane P1 of the silicon carbide layer 10. The source electrode 12 is in contact with the source region 30 and the electric field relaxation region 34. The contact region 12*a* that is a part of the source electrode 12 is positioned in the source trench 22. The contact region 12*a* is in contact with the source region 30 and the electric field relaxation region 34.

The source electrode 12 contains metal. The metal forming the source electrode 12 has, for example, a stacked structure of titanium (Ti) and aluminum (Al). The source electrode 12 may contain metal silicide or metal carbide in contact with the silicon carbide layer 10.

The drain electrode 14 is positioned on the second plane P2 side of the silicon carbide layer 10. The drain electrode 14 is provided on the second plane P2 of the silicon carbide layer 10. The drain electrode 14 is in contact with the drain region 24.

The drain electrode 14 is, for example, metal or a metal semiconductor compound. The drain electrode 14 contains, for example, a material selected from the group including nickel silicide (NiSi), titanium (Ti), nickel (Ni), silver (Ag), and gold (Au).

The $N^+$-type drain region 24 is provided on the second plane P2 side of the silicon carbide layer 10. The drain region 24 contains, for example, nitrogen (N) as an n-type impurity. The n-type impurity concentration of the drain region 24 is, for example, $1\times10^{18}$ $cm^{-3}$ or more and $1\times10^{21}$ $cm^{-3}$ or less.

The $n^-$-type drift region 26 is provided on the drain region 24. The drift region 26 is positioned between the second plane P2 and the drain region 24.

The drift region 26 contains, for example, nitrogen (N) as an n-type impurity. The n-type impurity concentration of the drift region 26 is, for example, $4\times10^{14}$ $cm^{-3}$ or more and $1\times10^{18}$ $cm^{-3}$ or less.

The p-type body region 28 is positioned between the drift region 26 and the first plane Pl. The body region 28 functions as a channel region of the MOSFET 100. For example, when the MOSFET 100 is turned on, a channel through which electrons flow is formed in a region of the body region 28 in contact with the gate insulating layer 18. The region of the body region 28 in contact with the gate insulating layer 18 is a channel formation region.

The body region 28 contains, for example, aluminum (Al) as a p-type impurity. The p-type impurity concentration of the body region 28 is, for example, $5\times10^{16}$ $cm^{-3}$ or more and $5\times10^{17}$ $cm^{-3}$ or less.

The depth of the body region 28 is shallower than the depths of the gate trench 21 and the source trench 22. The depth of the body region 28 is, for example, 0.2 μm or more and 1.0 μm or less.

The $n^+$-type source region 30 is positioned between the body region 28 and the first plane Pl. The source region 30 is in contact with the source electrode 12. The source region 30 is in contact with the gate insulating layer 18.

The source region 30 contains, for example, phosphorus (P) as an n-type impurity. The n-type impurity concentration of the source region 30 is higher than the n-type impurity concentration of the drift region 26. The n-type impurity concentration of the source region 30 is, for example, $1\times10^{19}$ $cm^{-3}$ or more and $1\times10^{21}$ $cm^{-3}$ or less.

The depth of the source region 30 is shallower than the depth of the body region 28. The depth of the source region 30 is, for example, 0.1 μm or more and 0.3 μm or less.

The $p^+$-type gate trench bottom region 32 is positioned between the gate trench 21 and the drift region 26. The gate trench bottom region 32 is in contact with the bottom plane of the gate trench 21. The gate trench bottom region 32 is in contact with the gate insulating layer 18.

As shown in FIGS. 2 and 4, the gate trench bottom region 32 is in contact with the electric field relaxation region 34 at the bottom of the trench 22. The gate trench bottom region 32 is in contact with the second portion 34*y* of the electric field relaxation region 34.

The gate trench bottom region 32 has a function of relaxing the electric field applied to the gate insulating layer 18 when the MOSFET 100 is turned off. The gate trench bottom region 32 is fixed at the same potential as, for example, the source electrode 12 via the electric field relaxation region 34.

The gate trench bottom region 32 contains, for example, aluminum (Al) as a p-type impurity. The p-type impurity concentration of the gate trench bottom region 32 is higher than, for example, the p-type impurity concentration of the body region 28. The p-type impurity concentration of the gate trench bottom region 32 is, for example, 10 times or more the p-type impurity concentration of the body region 28.

The p-type impurity concentration of the gate trench bottom region 32 is, for example, $5\times10^{17}$ $cm^{-3}$ or more and $5\times10^{19}$ $cm^{-3}$ or less.

The $p^+$-type electric field relaxation region 34 is positioned between the source trench 22 and the drift region 26. The electric field relaxation region 34 is in contact with the bottom plane of the source trench 22. The electric field relaxation region 34 is in contact with the contact region 12*a* of the source electrode 12.

The electric field relaxation region 34 is positioned between, for example, the source trench 22 and the body region 28. The electric field relaxation region 34 is in contact with, for example, the side plane of the source trench 22. The electric field relaxation region 34 is provided, for example, at the bottom and around the side planes of the source trench 22.

The electric field relaxation region 34 has a first portion 34*x* and a second portion 34*y*. The first portion 34*x* is in contact with the first region 22*x*. The second portion 34*y* is in contact with the second region 22*y*.

The first portion 34*x* is separated from the gate trench bottom region 32. The drift region 26 is positioned between the first portion 34*x* and the gate trench bottom region 32. A part of the drift region 26 is sandwiched between the first portion 34*x* and the gate trench bottom region 32.

The second portion 34*y* is in contact with the gate trench bottom region 32. For example, the second portion 34*y* is in contact with the gate trench bottom region 32 between the second region 22*y*, in which the width of the source trench 22 in the second direction is increased, and the gate trench bottom region 32.

The electric field relaxation region 34 has a function of relaxing the electric field applied to the gate insulating layer 18 when the MOSFET 100 is turned off. The electric field relaxation region 34 is fixed at the same electric potential as, for example, the source electrode 12.

The electric field relaxation region 34 has a function of fixing the gate trench bottom region 32 at the same electric potential as the source electrode 12 by having the second portion 34*y* in contact with the gate trench bottom region 32.

The electric field relaxation region 34 contains, for example, aluminum (Al) as a p-type impurity. The p-type impurity concentration of the electric field relaxation region 34 is higher than the p-type impurity concentration of the body region 28. The p-type impurity concentration of the electric field relaxation region 34 is, for example, 10 times or more the p-type impurity concentration of the body region 28. The p-type impurity concentration of the electric field relaxation region 34 is, for example, $5\times10^{17}$ $cm^{-3}$ or more and $5\times10^{20}$ $cm^{-3}$ or less.

The p-type impurity concentration of the electric field relaxation region 34 near the bottom plane of the source trench 22 is higher than, for example, the p-type impurity concentration near the side plane of the source trench 22. The p-type impurity concentration of the portion of the electric field relaxation region 34 in contact with the bottom plane of the source trench 22 is higher than the p-type impurity concentration of the portion in contact with the side plane of the source trench 22.

The distance between the second plane P2 and the gate trench bottom region 32 (d6 in FIG. 1) is, for example, greater than the distance between the second plane P2 and the electric field relaxation region 34 (d7 in FIG. 1). In other words, the depth of the electric field relaxation region 34 is deeper than, for example, the depth of the gate trench bottom region 32.

The distance between the second plane P2 and the gate trench 21 (d3 in FIG. 1) is, for example, greater than the distance between the second plane P2 and the electric field relaxation region 34 (d7 in FIG. 1). In other words, the depth of the electric field relaxation region 34 is deeper than the depth of the gate trench 21.

Next, an example of a method for manufacturing the semiconductor device of the first embodiment will be described.

FIGS. 6, 7, 8, 9, 10, 11, 12, 13, and 14 are schematic sectional views illustrating an example of a method for manufacturing the semiconductor device of the first embodiment. FIGS. 6, 7, 9, 11, and 13 are cross sections corresponding to FIG. 1. FIGS. 8, 10, 12, and 14 are cross sections corresponding to FIG. 2.

Figure 6:
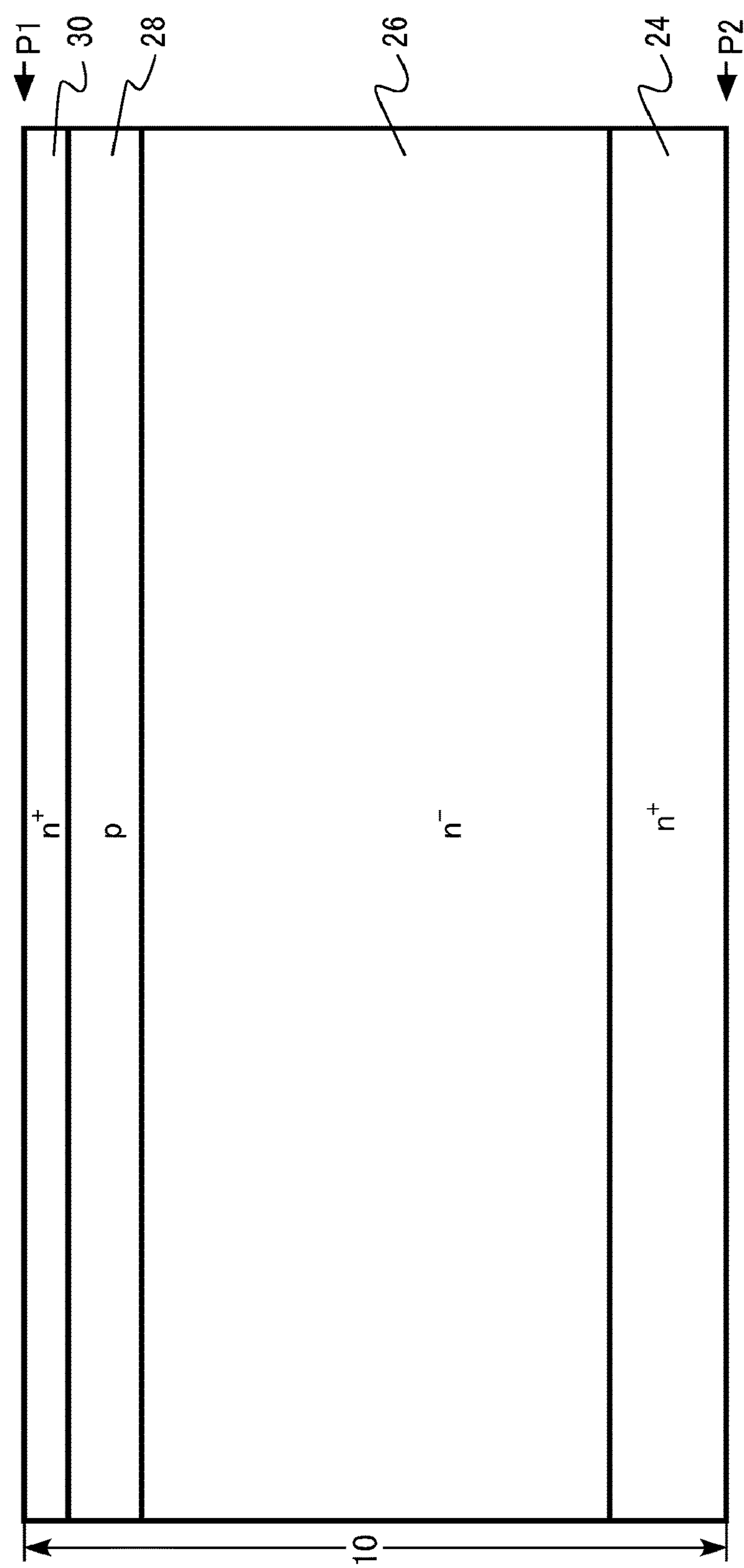
FIG. 6 is a schematic sectional view illustrating an example of a method for manufacturing the semiconductor device of the first embodiment.

First, a silicon carbide layer 10 including an type drain region 24, an $n^-$-type drift region 26, a p-type body region 28, and an $n^+$-type source region 30 is prepared (FIG. 6). The $n^-$-type drift region 26 is formed on the drain region 24 by, for example, epitaxial growth. The p-type body region 28 and the $n^+$-type source region 30 are formed by, for example, ion-implanting p-type impurities and n-type impurities into the drift region 26.

Figure 7:
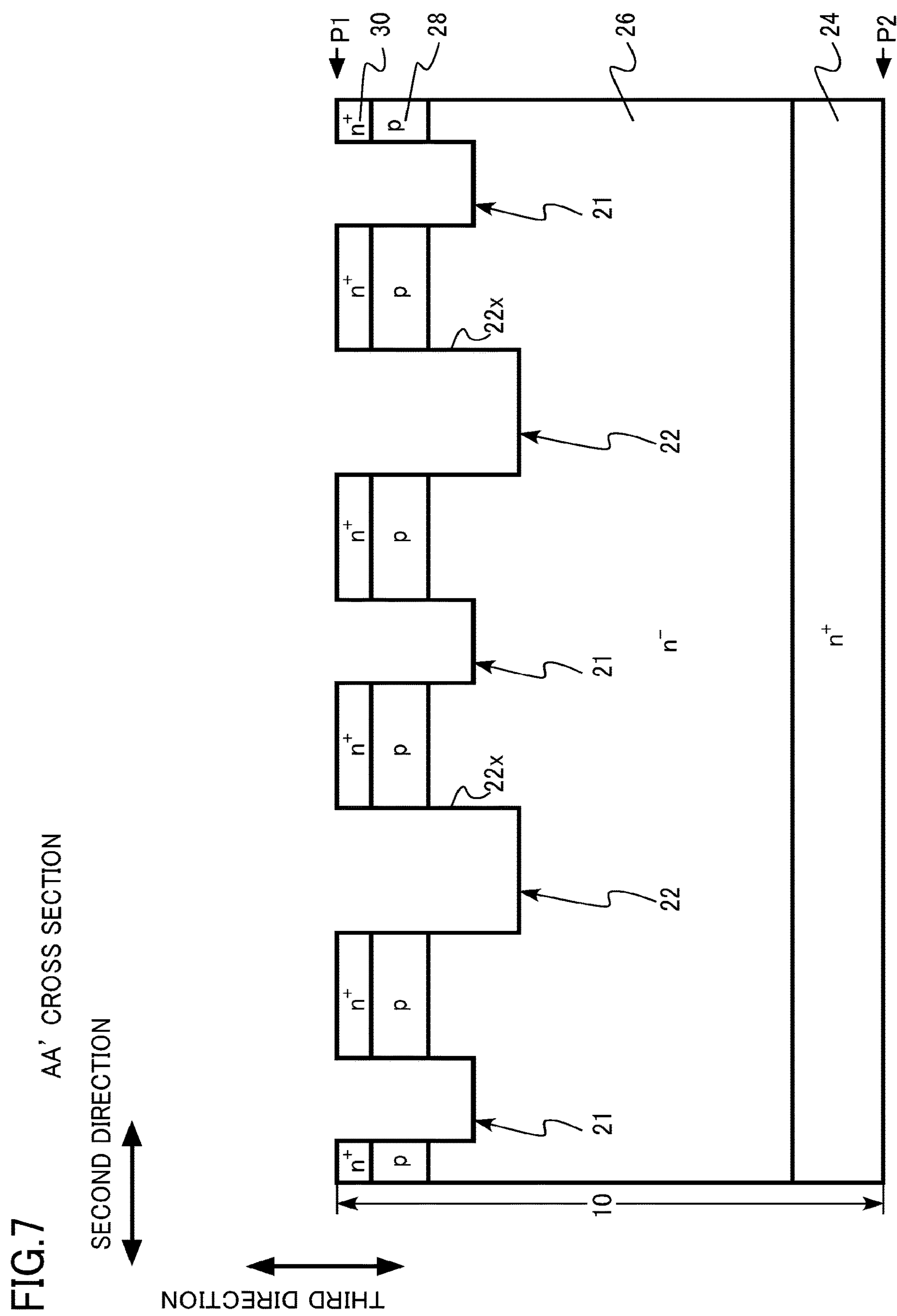
FIG. 7 is a schematic sectional view illustrating the example of the method for manufacturing the semiconductor device of the first embodiment.
Figure 8:
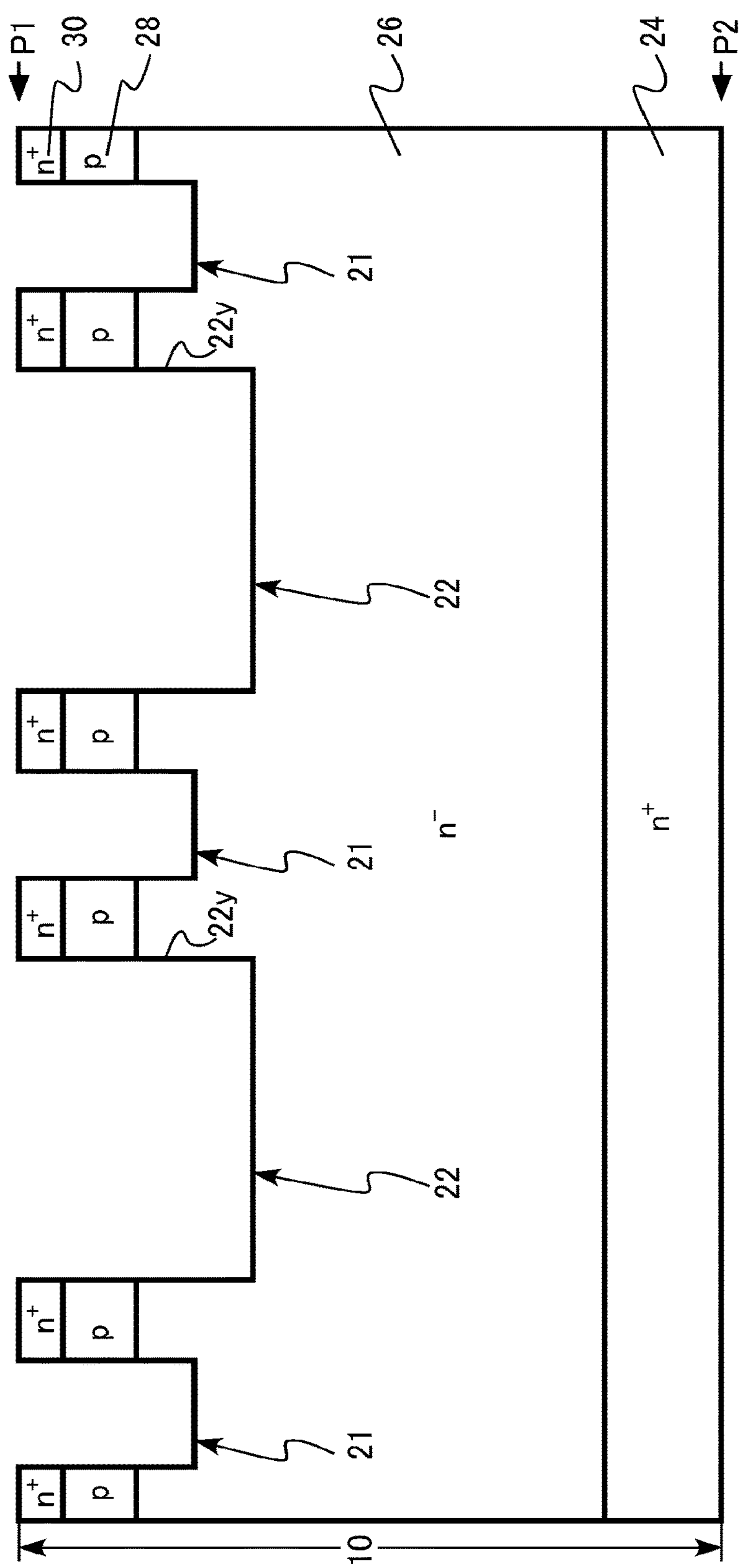
FIG. 8 is a schematic sectional view illustrating the example of the method for manufacturing the semiconductor device of the first embodiment.

Next, a gate trench 21 and a source trench 22 are formed on the front face of the silicon carbide layer 10 by a known process technique (FIGS. 7 and 8). The gate trench 21 and the source trench 22 may be formed separately or simultaneously. The gate trench 21 and the source trench 22 are formed so as to pass through the source region 30 and the body region 28.

The source trench 22 is formed to have a first region 22*x* and a second region 22*y* having different widths in the second direction.

Next, a mask material 50 covering the source trench 22 is formed by a known process technique. The mask material 50 is, for example, a photoresist.

Figure 9:
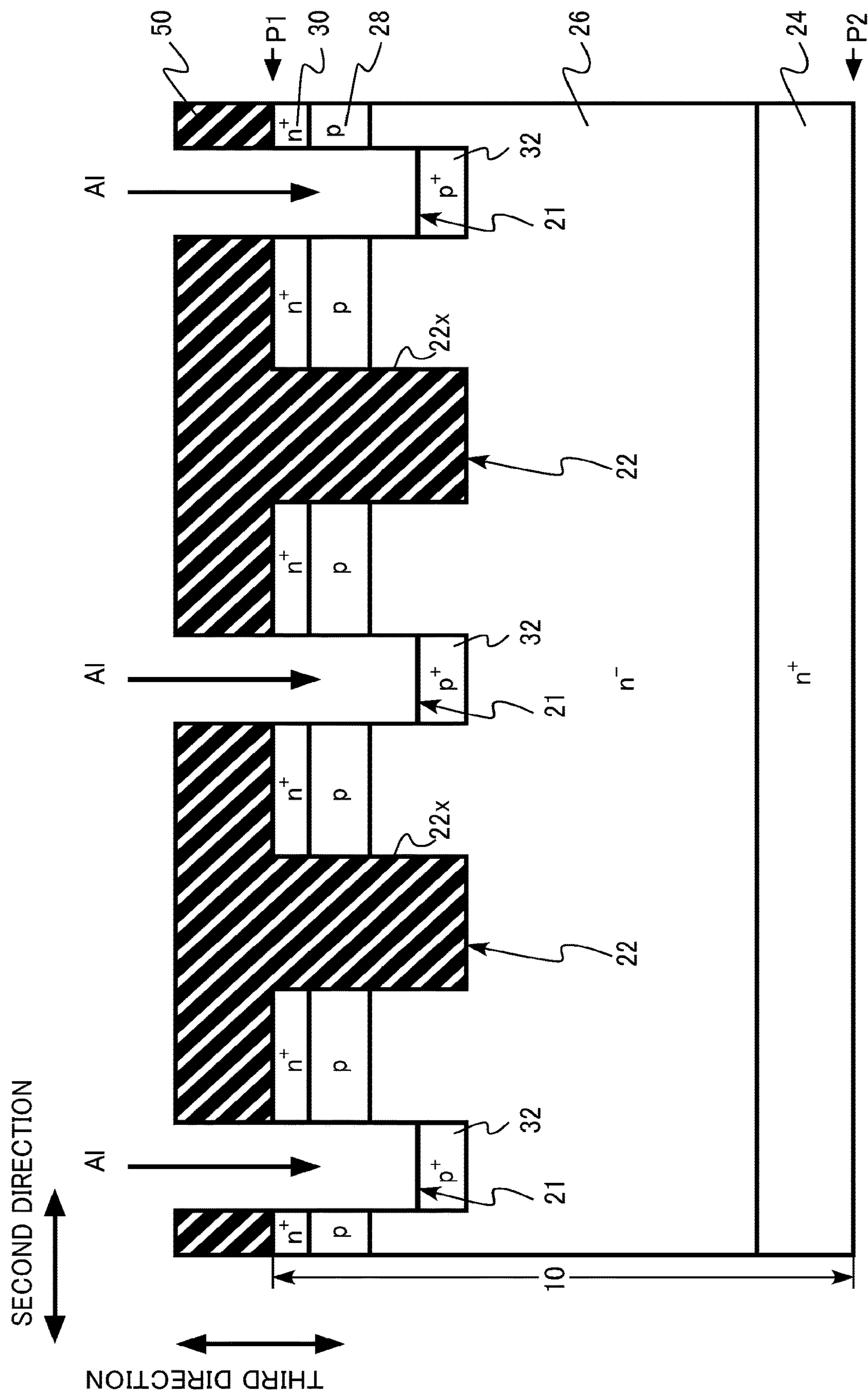
FIG. 9 is a schematic sectional view illustrating the example of the method for manufacturing the semiconductor device of the first embodiment.
Figure 10:
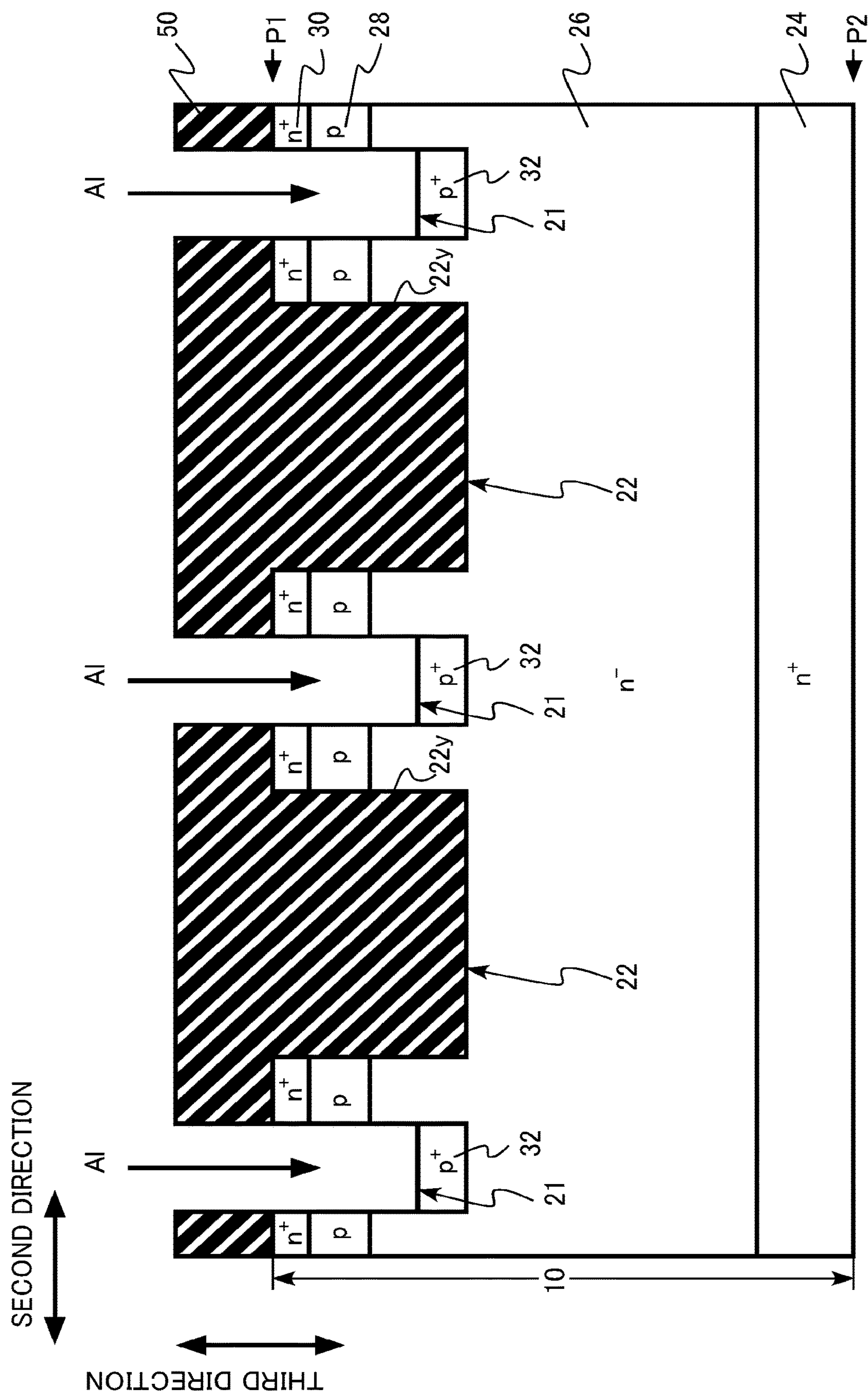
FIG. 10 is a schematic sectional view illustrating the example of the method for manufacturing the semiconductor device of the first embodiment.

Next, by implanting aluminum ions by ion implantation using the mask material 50 as a mask, a $p^-$-type gate trench bottom region 32 is formed at the bottom of the gate trench 21 (FIGS. 9 and 10). It is also possible to introduce p-type impurities into the bottom of the source trench 22 without providing the mask material 50 covering the source trench 22.

Next, the mask material 50 is removed. Next, a mask material 52 covering the gate trench 21 is formed by a known process technique. The mask material 52 is, for example, a photoresist.

Figure 11:
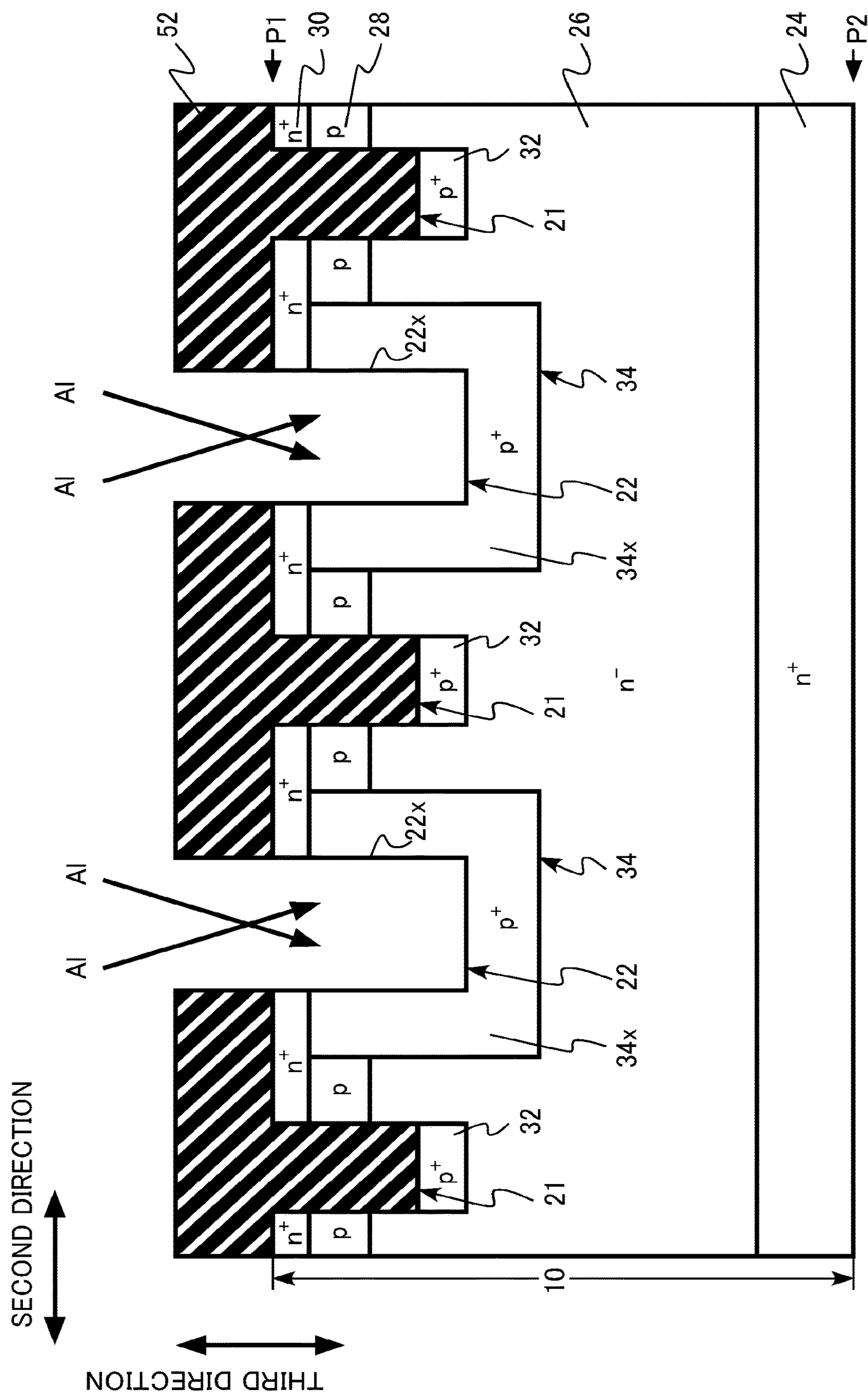
FIG. 11 is a schematic sectional view illustrating the example of the method for manufacturing the semiconductor device of the first embodiment.
Figure 12:
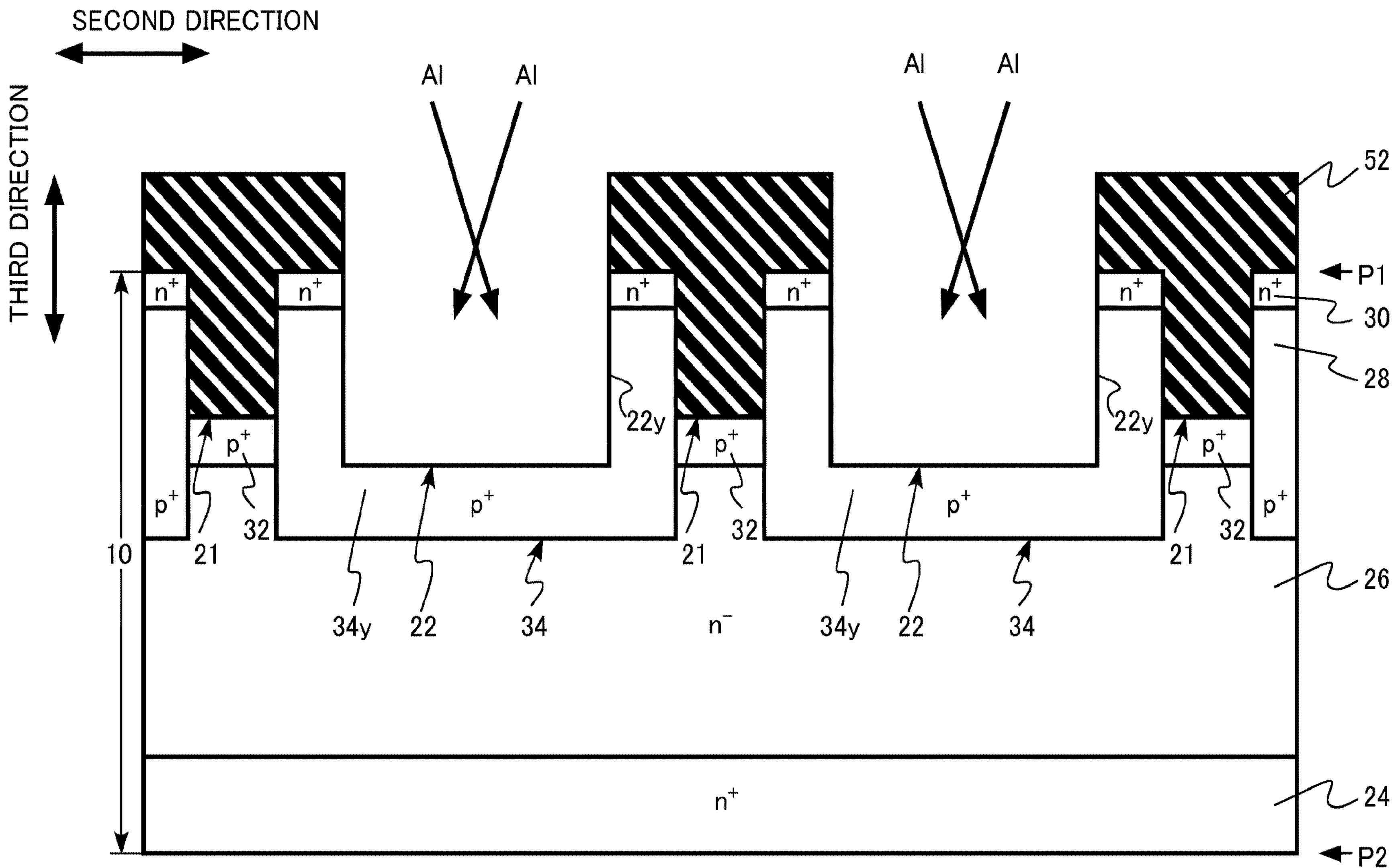
FIG. 12 is a schematic sectional view illustrating the example of the method for manufacturing the semiconductor device of the first embodiment.

Next, by implanting aluminum ions by oblique ion implantation using the mask material 52 as a mask, a $p^+$-type electric field relaxation region 34 is formed (FIGS. 11 and 12). A portion in contact with the first region 22*x* of the source trench 22 becomes a first portion 34*x* (FIG. 11). A portion in contact with the second region 22*y* of the source trench 22 becomes a second portion 34*y* (FIG. 12).

The first portion 34*x* is separated from the gate trench bottom region 32. The second portion 34*y* is in contact with the gate trench bottom region 32.

Next, the mask material 52 is removed. Next, a heat treatment for activating n-type impurities and p-type impurities in the silicon carbide layer 10 is performed.

Figure 13:
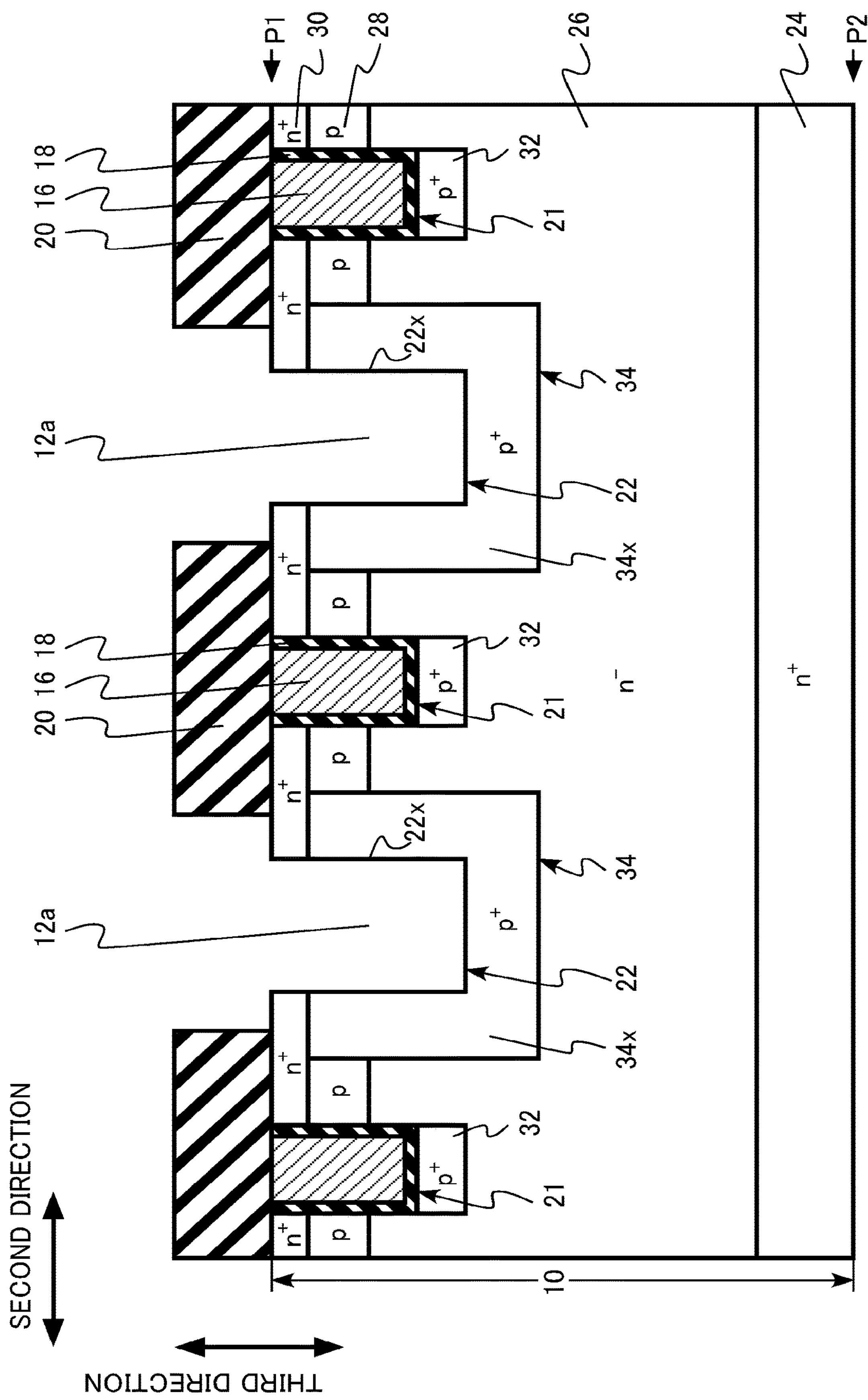
FIG. 13 is a schematic sectional view illustrating the example of the method for manufacturing the semiconductor device of the first embodiment.
Figure 14:
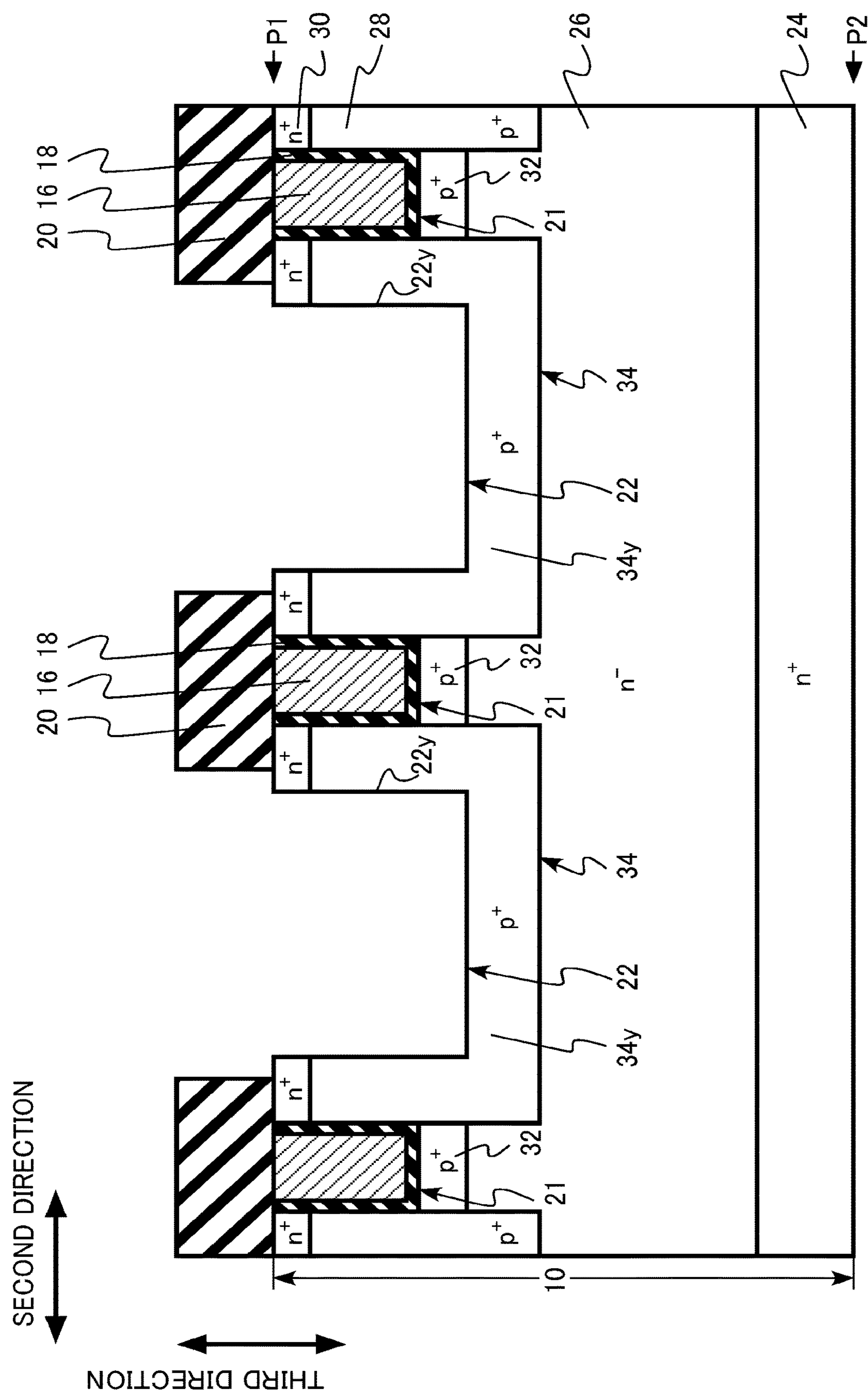
FIG. 14 is a schematic sectional view illustrating the example of the method for manufacturing the semiconductor device of the first embodiment.

Next, a gate insulating layer 18 and a gate electrode 16 are formed in the gate trench 21 by a known process technique. Furthermore, an interlayer insulating layer 20 is formed on the gate electrode 16 by a known process technique (FIGS. 13 and 14).

Then, a source electrode 12 and a drain electrode 14 are formed by a known process technique. A part of the source electrode 12 is embedded in the source trench 22. The MOSFET 100 illustrated in FIGS. 1 to 5 is manufactured by the above manufacturing method.

Next, the function and effect of the semiconductor device of the first embodiment will be described.

To the MOSFET 100, a trench gate structure in which the gate electrode 16 is provided in the gate trench 21 is applied. By applying the trench gate structure, a channel area per unit area is increased, and on-resistance of the MOSFET 100 is reduced.

In addition, in the MOSFET 100, the contact region 12*a* that is a part of the source electrode 12 is provided in the source trench 22. The MOSFET 100 is a MOSFET having what is called a double trench structure. By providing the contact region 12*a* in the source trench 22, it is possible to electrically connect the body region 28 with the source region 30 at the side plane of the trench 22. Thus, it is possible to reduce the connection area of the source electrode 12 on the front face of the silicon carbide layer 10. Accordingly, the channel area per unit area is Increased, and the on-resistance of the MOSFET 100 is reduced.

In addition, the MOSFET 100 includes the gate trench bottom region 32 on the bottom plane of the gate trench 21. Thus, the electric field applied to the gate insulating layer 18 is relaxed when the MOSFET 100 is turned off. Accordingly, the reliability of the gate insulating layer 18 is improved.

In addition, the MOSFET 100 includes the electric field relaxation region 34 at the bottom and around the side planes of the source trench 22. Thus, the electric field applied to the gate insulating layer 18 is relaxed when the MOSFET 100 is turned off. Accordingly, the reliability of the gate insulating layer 18 is improved.

The gate trench bottom region 32 is in contact with the second portion 34*y* of the electric field relaxation region 34. Thus, it is possible to fix the electric potential of the gate trench bottom region 32 at the electric potential of the source electrode 12 via the electric field relaxation region 34. In particular, by fixing the electric potential of the gate trench bottom region 32 at the electric potential of the source electrode 12 via the electric field relaxation region 34 having a higher p-type impurity concentration and lower resistance than those of the body region 28, it is possible to firmly fix the electric potential of the source electrode 12.

If the electric potential of the gate trench bottom region 32 is not fixed, that is, if the gate trench bottom region 32 is in a floating state, for example, the electric potential of the gate electrode 16 can be unstable, and the switching loss of the MOSFET can be increased. By fixing the electric potential of the gate trench bottom region 32 at the electric potential of the source electrode 12, the switching loss of the MOSFET 100 is reduced.

Furthermore, if the electric potential of the gate trench bottom region 32 is not fixed, the short-circuit withstanding capability of the MOSFET can be reduced. By fixing the electric potential of the gate trench bottom region 32 at the electric potential of the source electrode 12, the short-circuit withstanding capability of the MOSFET 100 is improved.

In the MOSFET 100, by forming the gate trench 21 and, then, introducing a p-type impurity from the bottom plane of the gate trench 21 by ion implantation, the gate trench bottom region 32 is formed. In addition, by forming the source trench 22 and, then, introducing a p-type impurity from the bottom plane or side plane of the source trench 22 by ion implantation, the electric field relaxation region 34 is formed.

Thus, it is possible to manufacture the deep gate trench bottom region 32 and the electric field relaxation region 34 without a costly manufacturing process, such as high-energy ion implantation. In addition, it is possible to electrically connect the gate trench bottom region 32 with the electric field relaxation region 34 by only partially increasing the width of the source trench 22 without any additional process. Thus, it is possible to reduce the manufacturing cost of the MOSFET 100.

From the viewpoint of relaxing the electric field strength applied to the gate insulating layer 18, the distance between the second plane P2 and the gate trench bottom region 32 (d6 in FIG. 1) is preferably greater than the distance between the second plane P2 and the electric field relaxation region 34 (d7 in FIG. 1). In other words, the depth of the electric field relaxation region 34 is preferably deeper than the depth of the gate trench bottom region 32.

From the viewpoint of relaxing the electric field strength applied to the gate insulating layer 18, the distance between the second plane P2 and the gate trench 21 (d3 in FIG. 1) is preferably greater than the distance between the second plane P2 and the electric field relaxation region 34 (d7 in FIG. 1). In other words, the depth of the electric field relaxation region 34 is preferably deeper than the depth of the gate trench 21

From the viewpoint of relaxing the electric field strength applied to the gate insulating layer 18, the distance between the second plane P2 and the gate trench 21 (d3 in FIG. 1) is preferably greater than the distance between the second plane P2 and the source trench 22 (d4 in FIG. 1). In other words, the depth of the source trench 22 is preferably deeper than the depth of the gate trench 21.

The second distance between the gate trench 21 and the second region 22*y* (d2 in FIG. 5) is preferably ⅓ or more and ⅔ or less of the first distance between the gate trench 21 and the first region 22*x* (d1 in FIG. 5). Since the second distance d2 is ⅓ or more of the first distance d1, a short circuit between the gate electrode 16 and the contact region 12*a* is suppressed. In addition, since the second distance d2 is ⅔ or less of the first distance d1, the gate trench bottom region 32 is firmly electrically connected with the electric field relaxation region 34.

The length of the second region 22*y* in the first direction (L2 in FIG. 5) is preferably shorter than the length of the first region 22*x* in the first direction (L1 in FIG. 5). Since the length L2 of the second region 22*y* in the first direction is shorter than the length L1 of the first region 22*x* in the first direction, the channel area per unit area is increased, and the on-resistance of the MOSFET 100 is reduced.

According to the first embodiment, it is possible to implement a MOSFET capable of reducing switching loss.

Second Embodiment

A semiconductor device of a second embodiment is different from the semiconductor device of the first embodiment in that an interlayer insulating layer positioned between a gate electrode and a first electrode, and a part of the interlayer insulating layer is positioned in a second region. Hereinafter, the description overlapping with the first embodiment will be partially omitted.

The semiconductor device of the second embodiment is a trench-gate-type vertical MOSFET 200 using silicon carbide. The MOSFET 200 is a MOSFET having a trench gate structure in which a gate electrode is provided in a first trench. In addition, the MOSFET 200 is a MOSFET having what is called a double trench structure in which a source electrode is provided in a second trench. The MOSFET 200 is an n-channel MOSFET using electrons as carriers.

Figure 15:
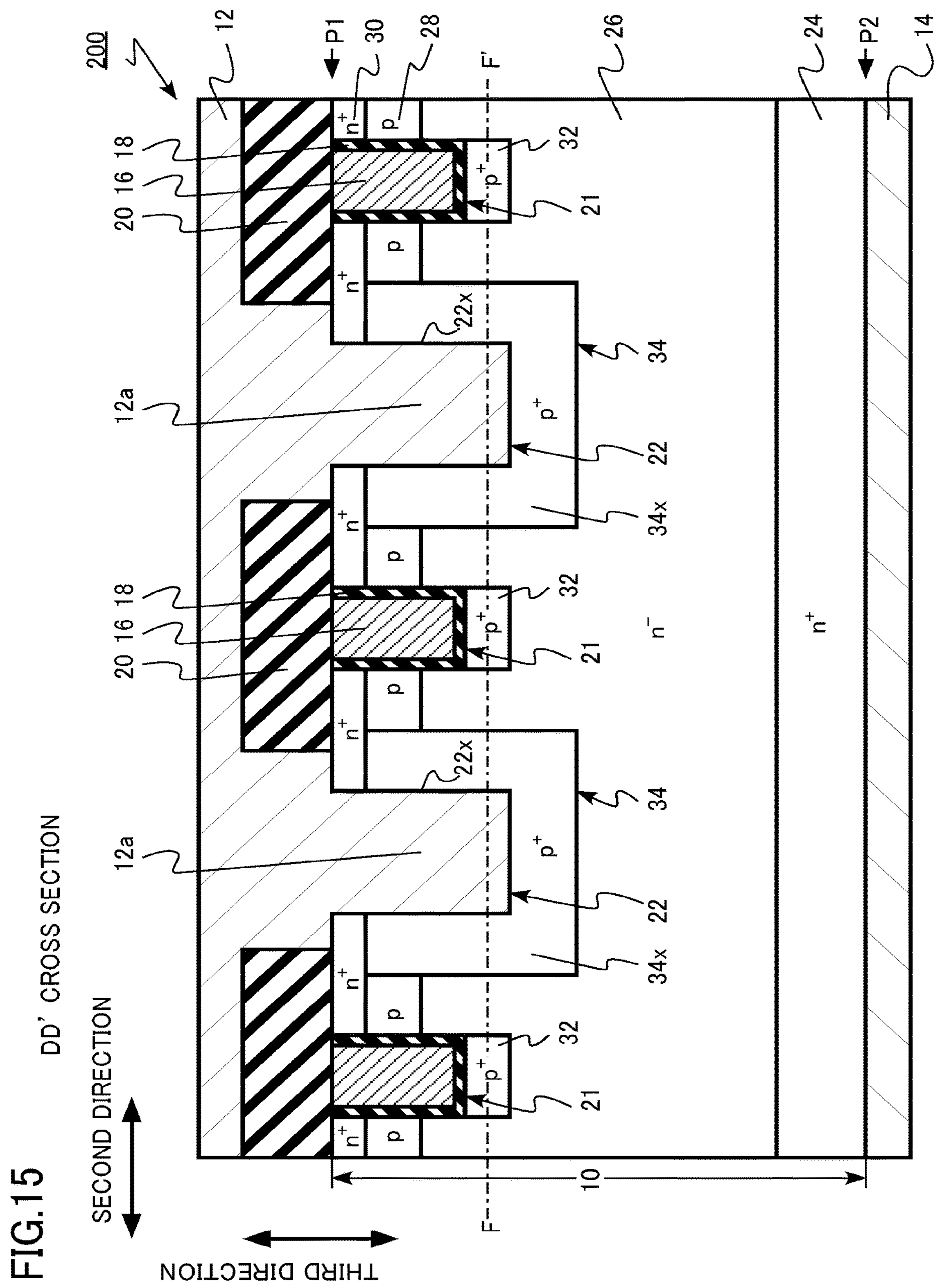
FIG. 15 is a schematic sectional view illustrating a semiconductor device of a second embodiment.
Figure 16:
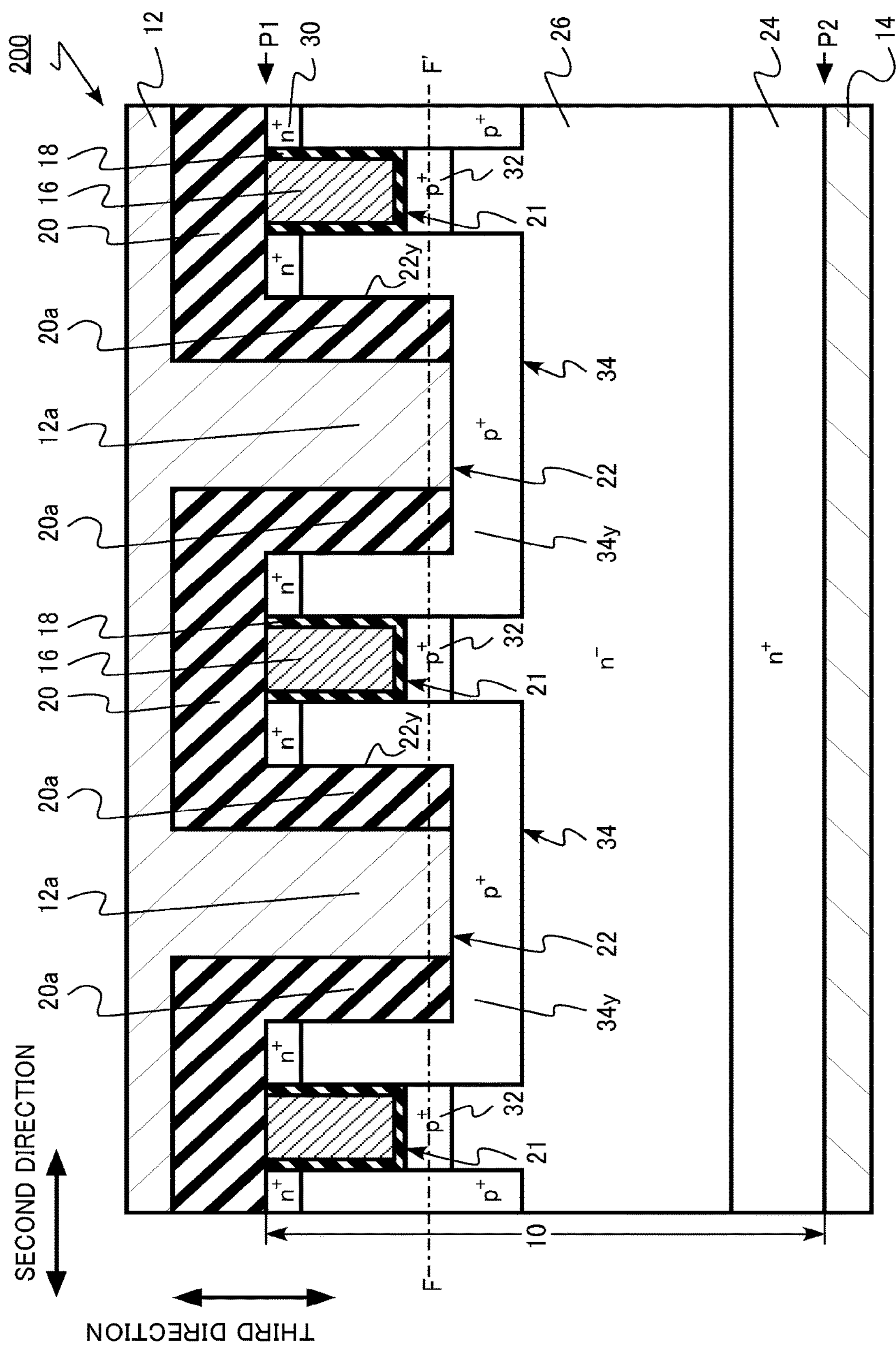
FIG. 16 is a schematic sectional view illustrating the semiconductor device of the second embodiment.
Figure 17:
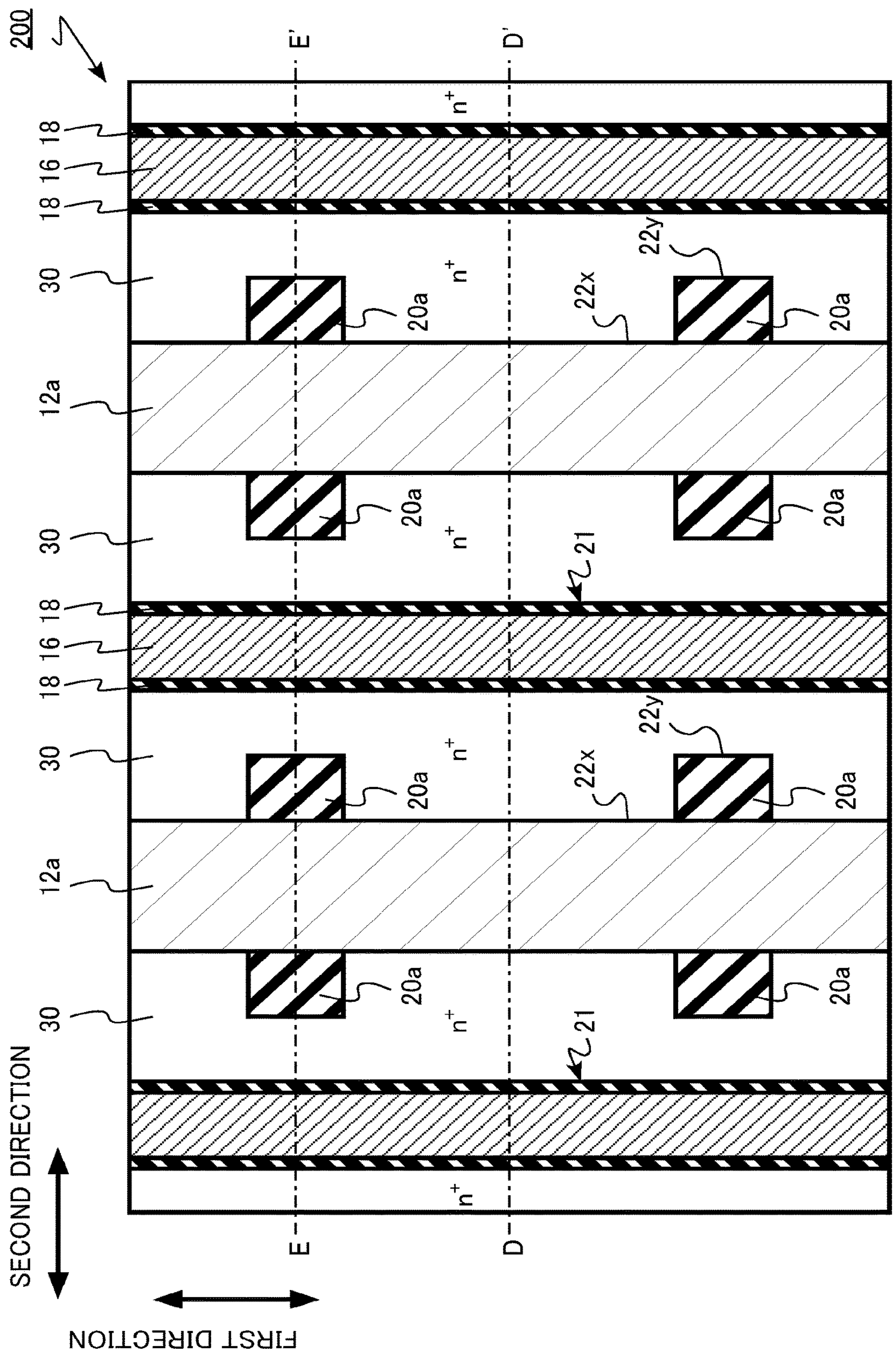
FIG. 17 is a schematic plan view illustrating the semiconductor device of the second embodiment.
Figure 18:
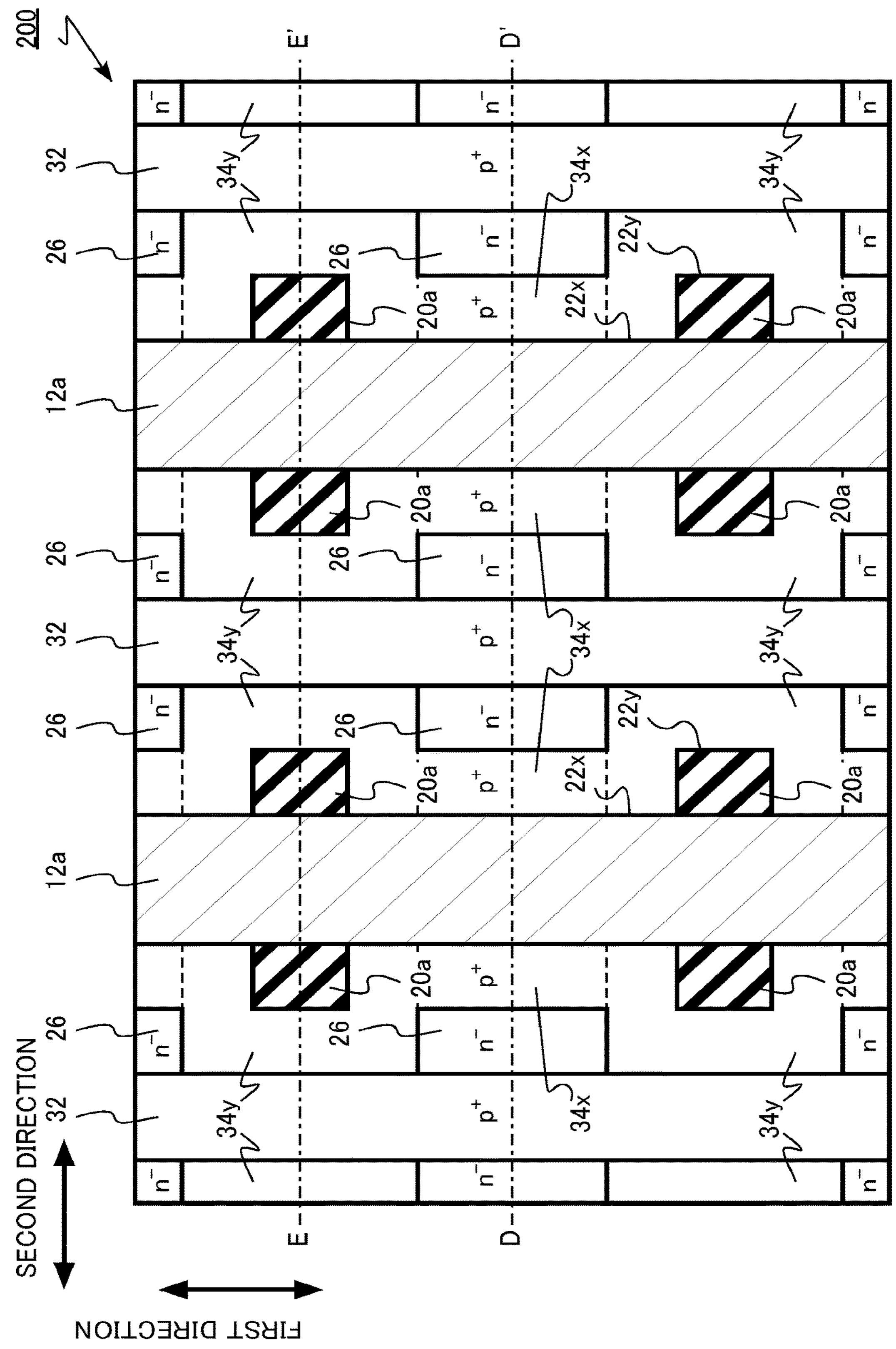
FIG. 18 is a schematic sectional view illustrating the semiconductor device of the second embodiment.

FIG. 15 is a schematic sectional view illustrating the semiconductor device of the second embodiment. FIG. 16 is a schematic sectional view illustrating the semiconductor device of the second embodiment. FIG. 17 is a schematic plan view illustrating the semiconductor device of the second embodiment. FIG. 18 is a schematic sectional view illustrating the semiconductor device of the second embodiment.

FIG. 15 is a sectional view taken along the line DD' of FIG. 17. FIG. 16 is a cross-sectional view taken along the line EE' of FIG. 17. FIG. 18 is a cross-sectional view taken along the line FF' of FIGS. 15 and 16.

The MOSFET 200 includes a silicon carbide layer 10, a source electrode 12 (a first electrode), a drain electrode 14 (a second electrode), a gate electrode 16, a gate insulating layer 18, and an interlayer insulating layer 20.

The silicon carbide layer 10 includes a gate trench (a first trench), a source trench 22 (a second trench), an $n^+$-type drain region 24, an $n^-$-type drift region 26 (a first silicon carbide region), a p-type body region 28 (a second silicon carbide region), an $n^+$-type source region 30 (a third silicon carbide region), a $p^+$-type gate trench bottom region 32 (a fourth silicon carbide region), and a $p^+$-type electric field relaxation region 34 (a fifth silicon carbide region).

The source trench 22 has a first region 22*x* and a second region 22*y*. The electric field relaxation region 34 has a first portion 34*x* and a second portion 34*y*. The source electrode 12 includes a contact region 12*a* (a part) that is a part of the source electrode 12. The interlayer insulating layer 20 includes a trench sidewall region 20*a* (a part) that is a part of the interlayer insulating layer 20.

The trench sidewall region 20*a* that is a part of the interlayer insulating layer is positioned in the second region 22*y* of the source trench 22. The trench sidewall region 20*a* is positioned between the gate electrode 16 and the contact region 12*a*. The second portion 34*y* of the electric field relaxation region 34 is sandwiched between the gate trench 21 and the trench sidewall region 20*a*.

The trench sidewall region 20*a* has a function of electrically separating the gate electrode 16 from the contact region 12*a*. By providing the trench sidewall region 20*a*, the distance between the gate electrode 16 and the contact region 12*a* is maintained if the distance between the gate electrode 16 and the second region 22*y* is reduced. Thus, the leakage current between the gate electrode 16 and the contact region 12*a* is suppressed. In addition, the breakdown voltage between the gate electrode 16 and the contact region 12*a* is improved.

According to the second embodiment, it is possible to implement a MOSFET capable of reducing switching loss, similarly to the first embodiment. In addition, the leakage current between the gate electrode 16 and the contact region 12*a* is suppressed. In addition, the breakdown voltage between the gate electrode 16 and the contact region 12*a* is improved.

Third Embodiment

A semiconductor device of a third embodiment is different from the semiconductor device of the first embodiment in that a pattern of a second trench is different. Hereinafter, the description overlapping with the first embodiment will be partially omitted.

The semiconductor device of the third embodiment is a trench-gate-type vertical MOSFET 300 using silicon carbide. The MOSFET 300 is a MOSFET having a trench gate structure in which a gate electrode is provided in a first trench. In addition, the MOSFET 300 is a MOSFET having what is called a double trench structure in which a source electrode is provided in a second trench. The MOSFET 300 is an n-channel MOSFET using electrons as carriers.

Figure 19:
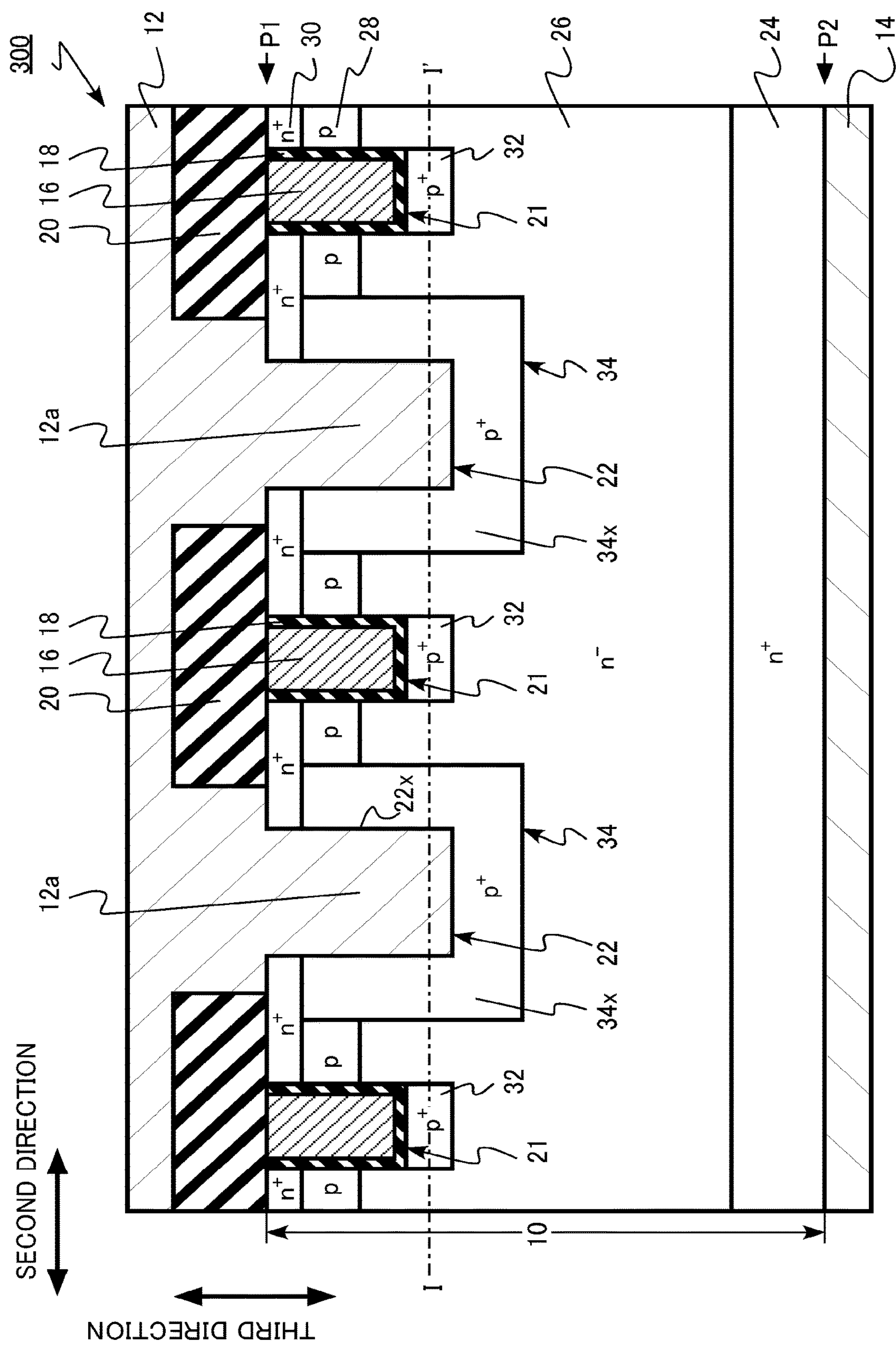
FIG. 19 is a schematic sectional view illustrating a semiconductor device of a third embodiment.
Figure 20:
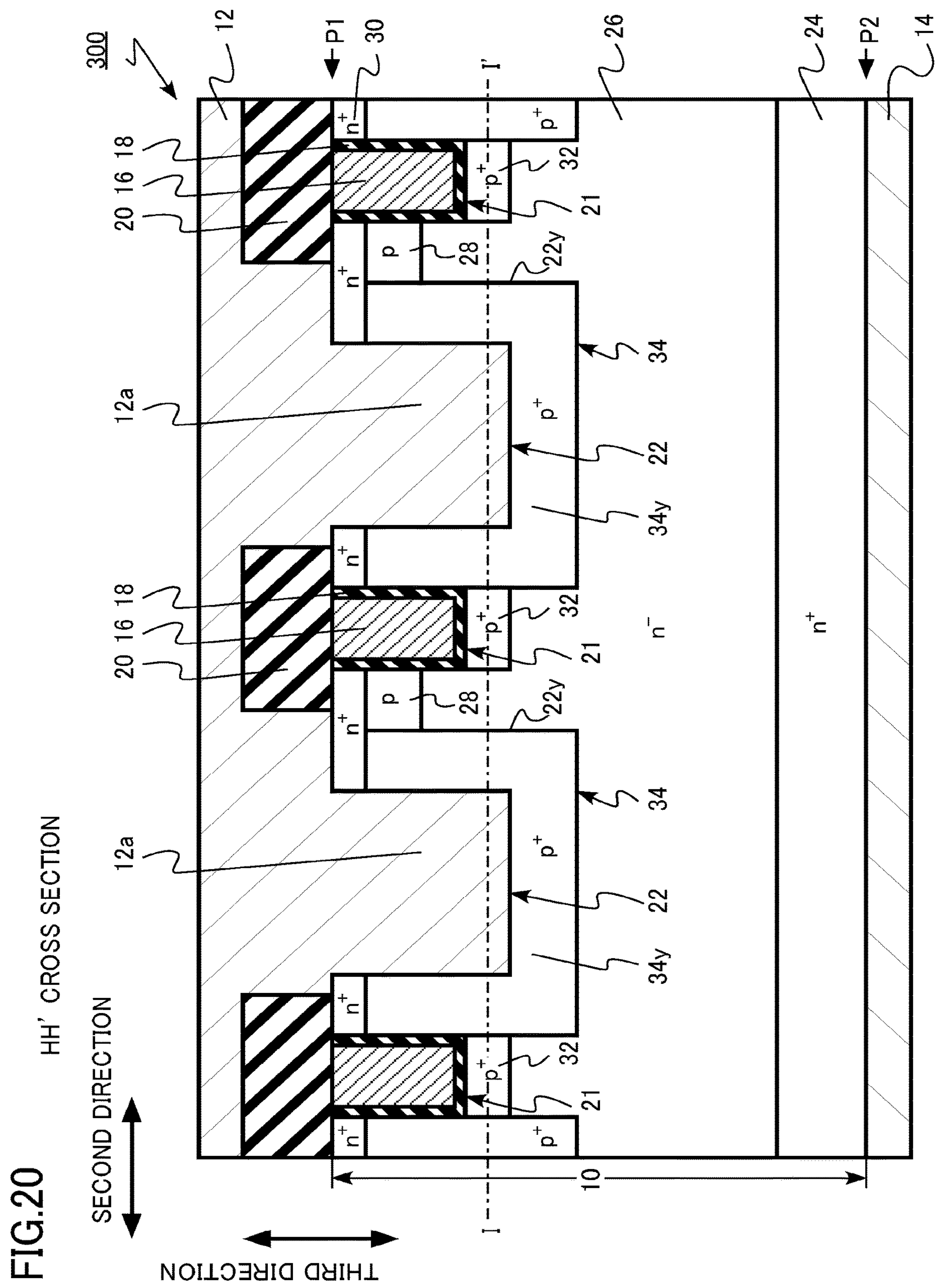
FIG. 20 is a schematic sectional view illustrating the semiconductor device of the third embodiment.
Figure 21:
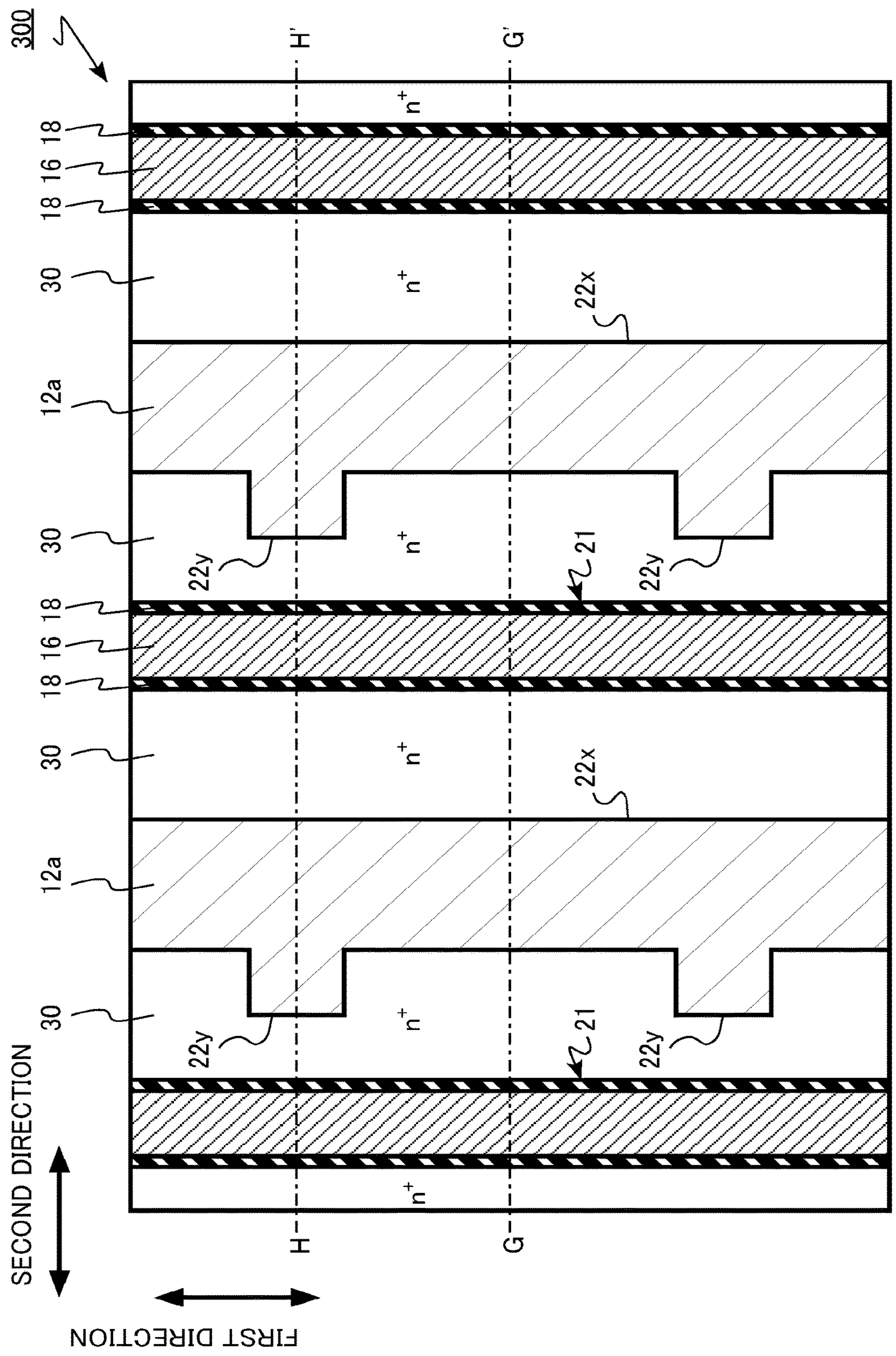
FIG. 21 is a schematic plan view illustrating the semiconductor device of the third embodiment.
Figure 22:
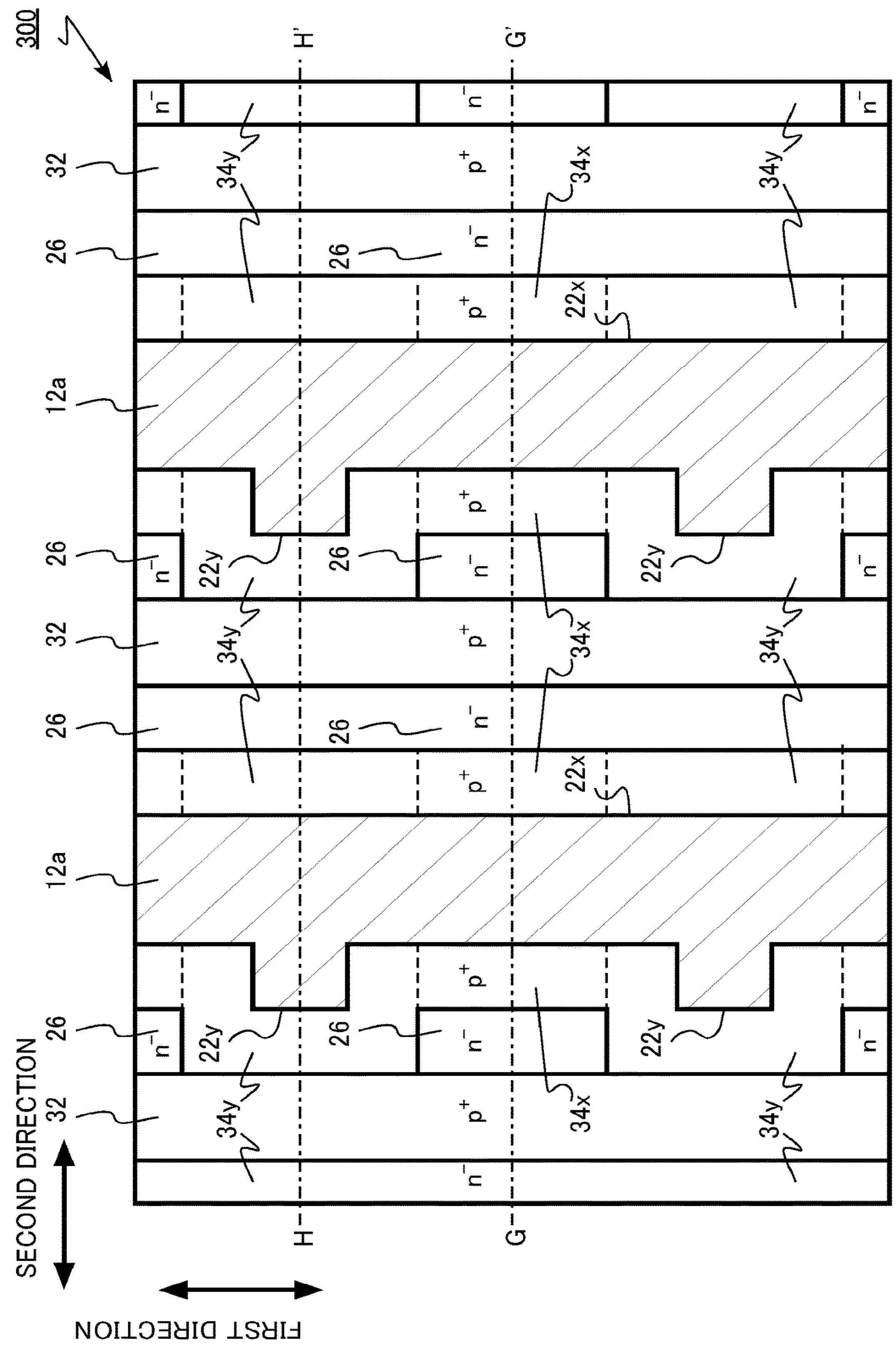
FIG. 22 is a schematic sectional view illustrating the semiconductor device of the third embodiment.

FIG. 19 is a schematic sectional view illustrating the semiconductor device of the third embodiment. FIG. 20 is a schematic sectional view illustrating the semiconductor device of the third embodiment. FIG. 21 is a schematic plan view illustrating the semiconductor device of the third embodiment. FIG. 22 is a schematic sectional view illustrating the semiconductor device of the third embodiment.

FIG. 19 is a cross-sectional view taken along the line GG' of FIG. 21. FIG. 20 is a cross-sectional view taken along the line HH' of FIG. 21. FIG. 22 is a cross-sectional view taken along the line II' of FIGS. 19 and 20.

The MOSFET 300 includes a silicon carbide layer 10, a source electrode 12 (a first electrode), a drain electrode 14 (a second electrode), a gate electrode 16, a gate insulating layer 18, and an interlayer insulating layer 20.

The silicon carbide layer 10 includes a gate trench (a first trench), a source trench 22 (a second trench), an $n^+$-type drain region 24, an $n^-$-type drift region 26 (a first silicon carbide region), a p-type body region 28 (a second silicon carbide region), an $n^+$-type source region 30 (a third silicon carbide region), a $p^+$-type gate trench bottom region 32 (a fourth silicon carbide region), and a $p^+$-type electric field relaxation region 34 (a fifth silicon carbide region).

The source trench 22 has a first region 22*x* and a second region 22*y*. The electric field relaxation region 34 has a first portion 34*x* and a second portion 34*y*. The source electrode 12 includes a contact region 12*a* (a part) that is a part of the source electrode 12.

In the pattern of the source trench 22, only a side plane of the trench in the second region 22*y* has a portion protruding from the first region 22*x*.

The MOSFET 300 has a larger channel area per unit area than the MOSFET 100 of the first embodiment, and the on-resistance of the MOSFET 300 is reduced.

According to the third embodiment, it is possible to implement a MOSFET capable of reducing switching loss, similarly to the first embodiment. In addition, it is possible to implement a MOSFET with reduced on-resistance.

Fourth Embodiment

A semiconductor device of a fourth embodiment is different from the semiconductor device of the first embodiment in that a pattern of a second trench is different. Hereinafter, the description overlapping with the first embodiment will be partially omitted.

The semiconductor device of the fourth embodiment is a trench-gate-type vertical MOSFET 400 using silicon carbide. The MOSFET 400 is a MOSFET having a trench gate structure in which a gate electrode is provided in a first trench. In addition, the MOSFET 400 is a MOSFET having what is called a double trench structure in which a source electrode is provided in a second trench. The MOSFET 400 is an n-channel MOSFET using electrons as carriers.

Figure 23:
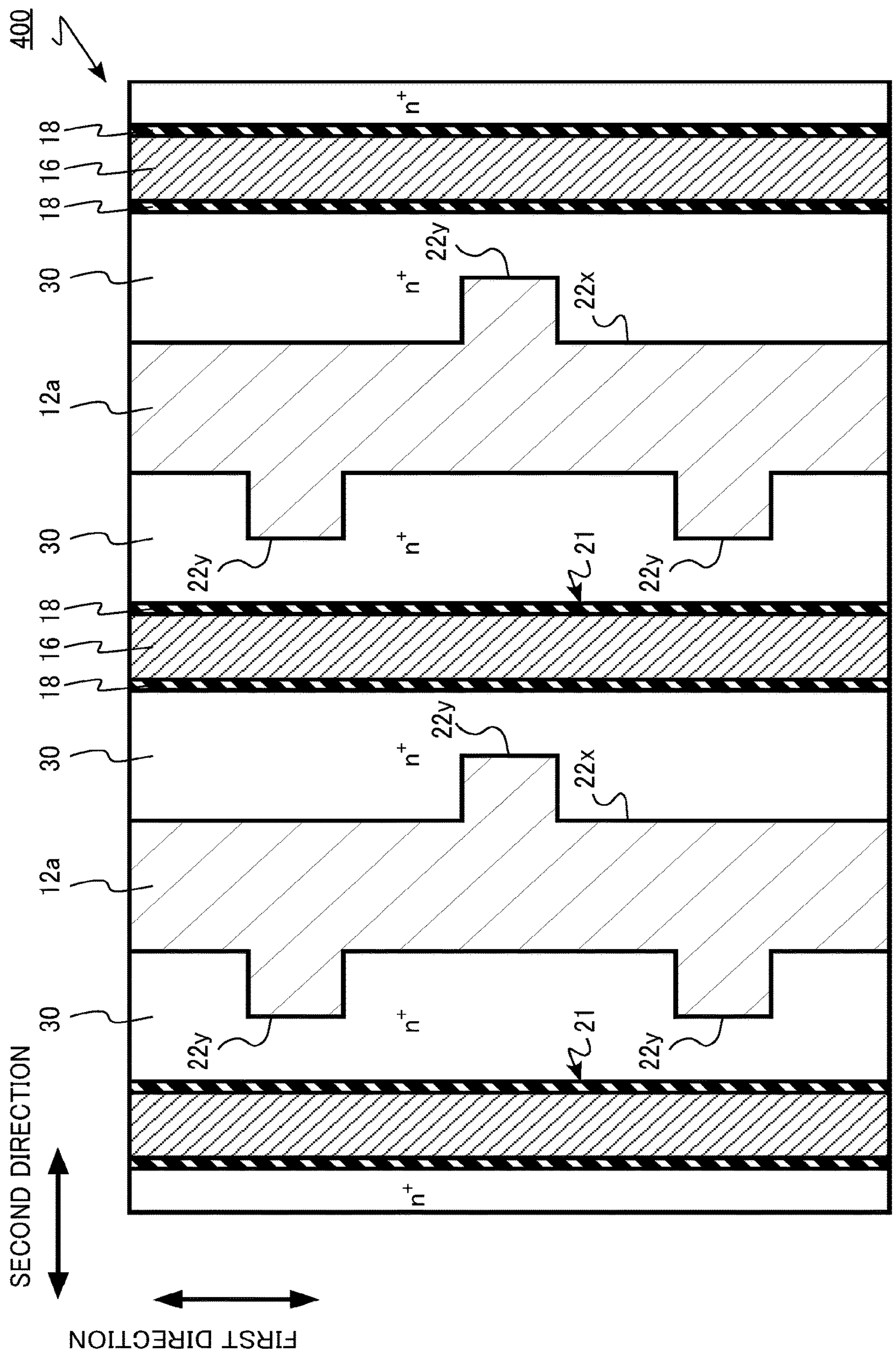
FIG. 23 is a schematic plan view illustrating a semiconductor device of a fourth embodiment.

FIG. 23 is a schematic plan view illustrating the semiconductor device of the fourth embodiment. FIG. 23 is a plan view corresponding to FIG. 3 of the first embodiment.

The pattern of a source trench 22 is a pattern in which a second region 22*y* has portions alternately protruding leftward and rightward with respect to the first direction.

According to the fourth embodiment, it is possible to implement a MOSFET capable of reducing switching loss, similarly to the first embodiment.

Fifth Embodiment

A semiconductor device of a fifth embodiment is different from the semiconductor device of the first embodiment in that patterns of a first trench and a second trench are different. Hereinafter, the description overlapping with the first embodiment will be partially omitted.

The semiconductor device of the fifth embodiment is a trench-gate-type vertical MOSFET 500 using silicon carbide. The MOSFET 500 is a MOSFET having a trench gate structure in which a gate electrode is provided in a first trench. In addition, the MOSFET 500 is a MOSFET having what is called a double trench structure in which a source electrode is provided in a second trench. The MOSFET 500 is an n-channel MOSFET using electrons as carriers.

Figure 24:
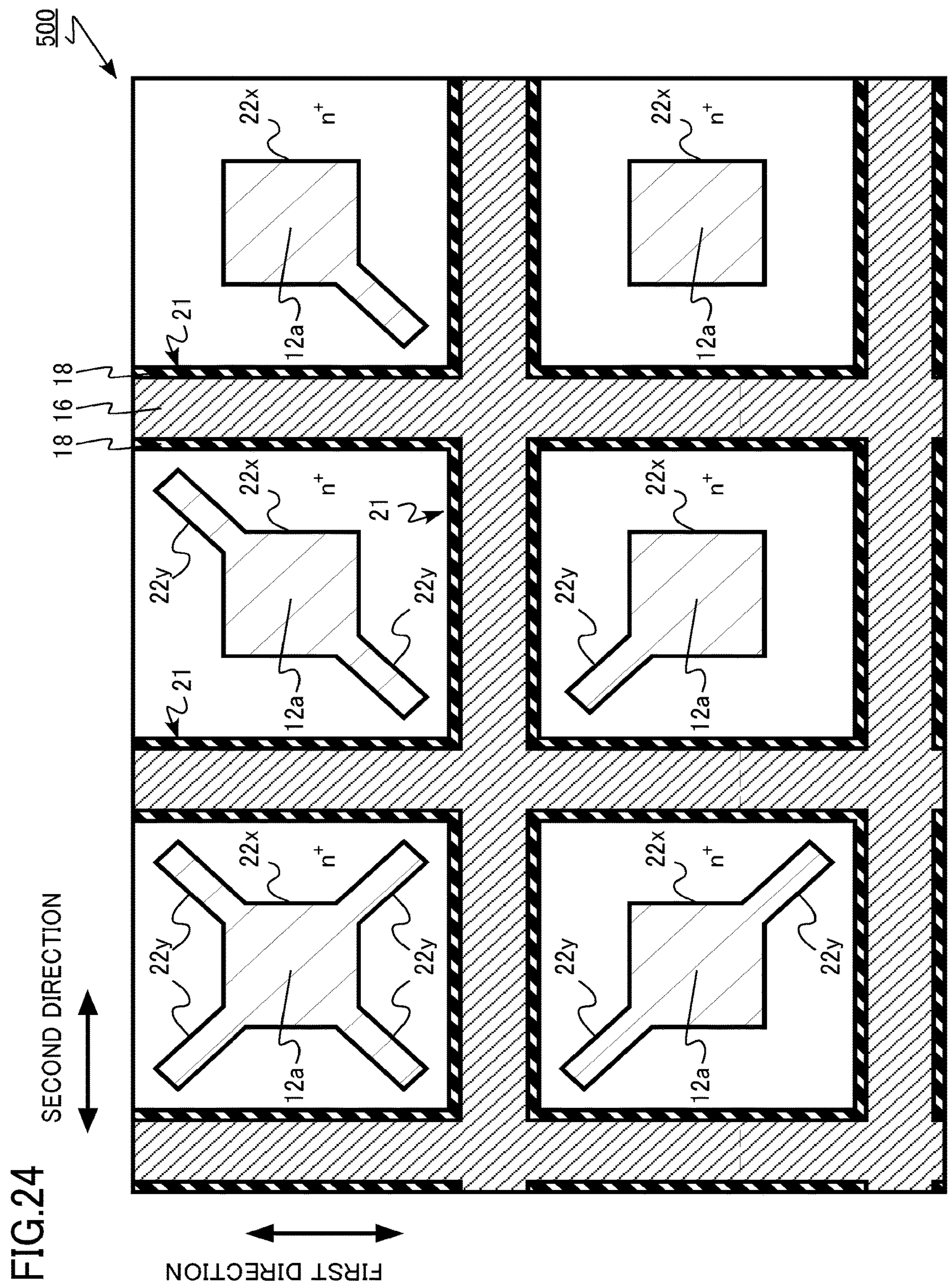
FIG. 24 is a schematic plan view illustrating a semiconductor device of a fifth embodiment.

FIG. 24 is a schematic plan view illustrating the semiconductor device of the fifth embodiment. FIG. 24 is a plan view corresponding to FIG. 3 of the first embodiment.

The pattern of a gate trench 21 is a lattice shape.

The pattern of a source trench 22 is a combination of a rectangular first region 22*x* and a second region 22*y* protruding from the first region 22*x*.

FIG. 24 illustrates a plurality of different patterns of the source trench 22 and a pattern with no second region 22*y*. The pattern of the source trench 22 may be, for example, only one pattern selected from the patterns in FIG. 24. Alternatively, the pattern of the source trench 22 may be, for example, a combination of a plurality of patterns selected from the patterns in FIG. 24.

Similarly to the MOSFET 100 of the first embodiment, an electric field relaxation region 34 in contact with the second region 22*y* is in contact with a gate trench bottom region 32 under the gate trench 21. Thus, it is possible to fix the electric potential of the gate trench bottom region 32 at the electric potential of the source electrode 12 via the electric field relaxation region 34.

According to the fifth embodiment, it is possible to implement a MOSFET capable of reducing switching loss, similarly to the first embodiment.

Sixth Embodiment

A semiconductor device of a sixth embodiment is different from the semiconductor device of the first embodiment in that patterns of a first trench and a second trench are different. Hereinafter, the description overlapping with the first embodiment will be partially omitted.

The semiconductor device of the sixth embodiment is a trench-gate-type vertical MOSFET 600 using silicon carbide. The MOSFET 600 is a MOSFET having a trench gate structure in which a gate electrode is provided in a first trench. In addition, the MOSFET 600 is a MOSFET having what is called a double trench structure in which a source electrode is provided in a second trench. The MOSFET 600 is an n-channel MOSFET using electrons as carriers.

Figure 25:
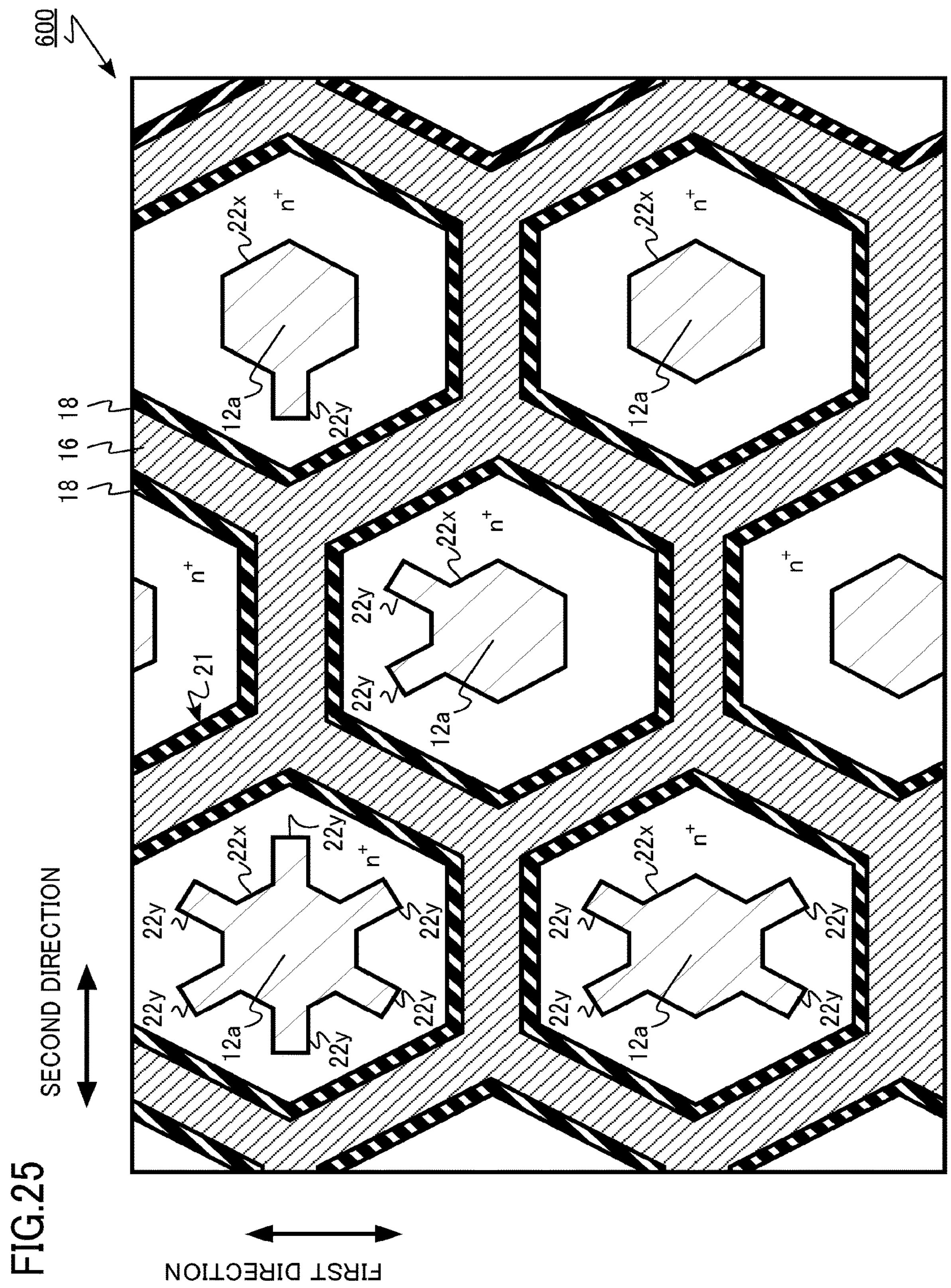
FIG. 25 is a schematic plan view illustrating a semiconductor device of a sixth embodiment.

FIG. 25 is a schematic plan view illustrating the semiconductor device of the sixth embodiment. FIG. 25 is a plan view corresponding to FIG. 3 of the first embodiment.

The pattern of a gate trench 21 is a pattern in which hexagonal sides are connected.

The pattern of a source trench 22 is a combination of a hexagonal first region 22*x* and a second region 22*y* protruding from the first region 22*x*.

FIG. 25 illustrates a plurality of different patterns of the source trench 22 and a pattern with no second region 22*y*. The pattern of the source trench 22 may be, for example, only one pattern selected from the patterns in FIG. 25. Alternatively, the pattern of the source trench 22 may be, for example, a combination of a plurality of patterns selected from the patterns in FIG. 25.

Similarly to the MOSFET 100 of the first embodiment, an electric field relaxation region 34 in contact with the second region 22*y* is in contact with a gate trench bottom region 32 under the gate trench 21. Thus, it is possible to fix the electric potential of the gate trench bottom region 32 at the electric potential of the source electrode 12 via the electric field relaxation region 34.

According to the sixth embodiment, it is possible to implement a MOSFET capable of reducing switching loss, similarly to the first embodiment.

Seventh Embodiment

A drive device including an inverter circuit of a seventh embodiment is a drive device including the semiconductor device of the first embodiment.

Figure 26:
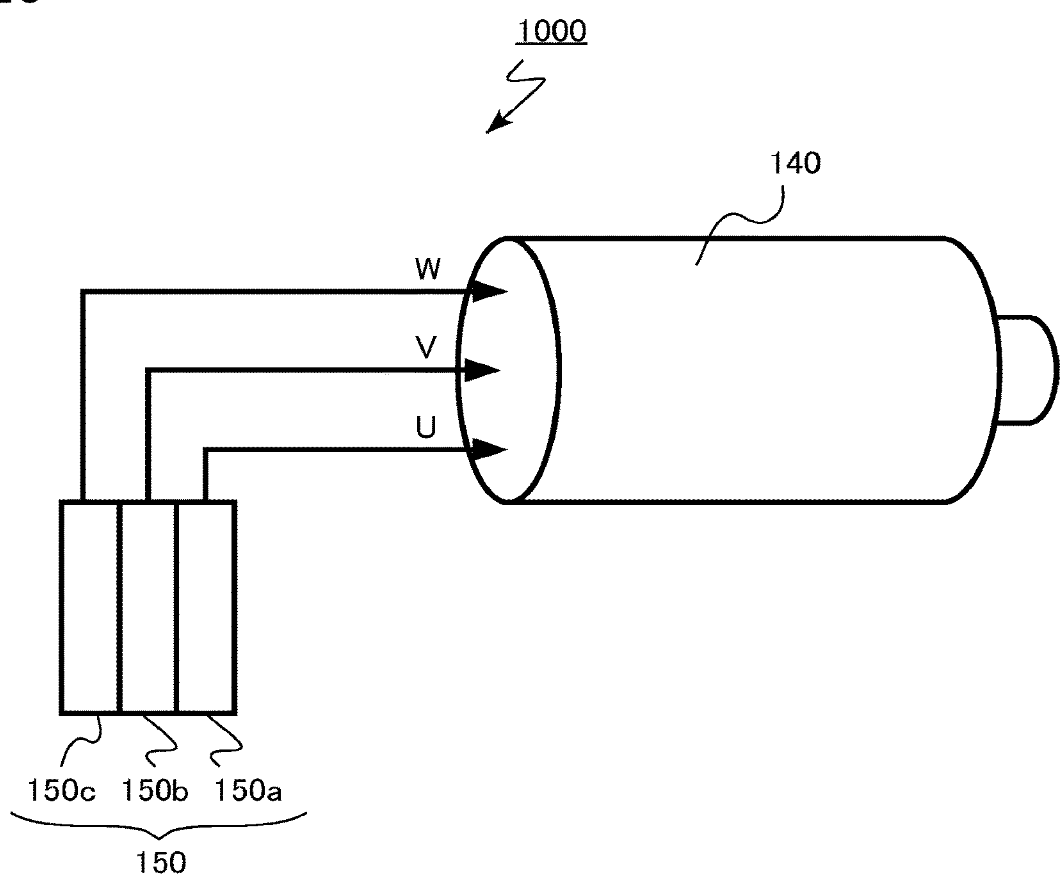
FIG. 26 is a schematic diagram illustrating a drive device of a seventh embodiment.

FIG. 26 is a schematic diagram illustrating the drive device of the seventh embodiment. A drive device 1000 includes a motor 140 and an inverter circuit 150.

The inverter circuit 150 includes three semiconductor modules 150*a*, 150*b*, and 150*c* each having the MOSFET 100 of the first embodiment as a switching element. By connecting the three semiconductor modules 150*a*, 150*b*, and 150*c* in parallel, the three-phase inverter circuit 150 including three AC voltage output terminals U, V, and W is implemented. The motor 140 is driven by the AC voltage output from the inverter circuit 150.

According to the seventh embodiment, with the MOSFET 100 having improved properties, it is possible to improve the properties of the inverter circuit 150 and the drive device 1000.

Eighth Embodiment

A vehicle of an eighth embodiment is a vehicle including the semiconductor device of the first embodiment.

Figure 27:
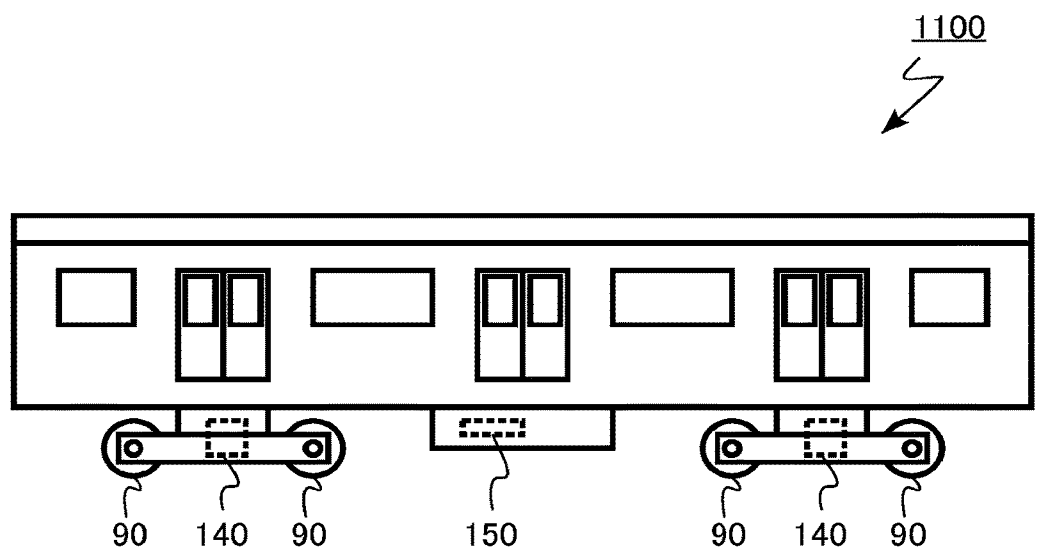
FIG. 27 is a schematic diagram illustrating a vehicle of an eighth embodiment.

FIG. 27 is a schematic diagram illustrating the vehicle of the eighth embodiment. A vehicle 1100 of the eighth embodiment is a railway vehicle. A vehicle 1100 includes a motor 140 and an inverter circuit 150.

The inverter circuit 150 includes three semiconductor modules each having the MOSFET 100 of the first embodiment as a switching element. By connecting the three semiconductor modules in parallel, the three-phase inverter circuit 150 including three AC voltage output terminals U, V, and W is implemented. The motor 140 is driven by the AC voltage output from the inverter circuit 150. Wheels 90 of the vehicle 1100 are rotated by the motor 140.

According to the eighth embodiment, with the MOSFET 100 having improved properties, it is possible to improve the properties of the vehicle 1100.

Ninth Embodiment

A vehicle of a ninth embodiment is a vehicle including the semiconductor device of the first embodiment.

Figure 28:
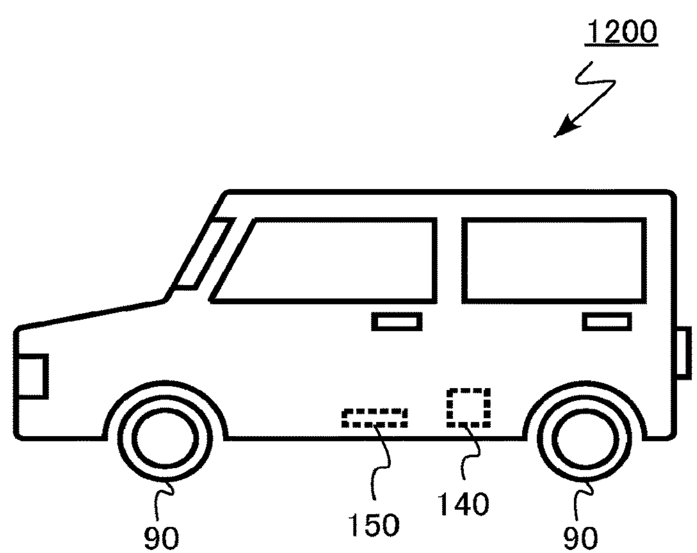
FIG. 28 is a schematic diagram illustrating a vehicle of a ninth embodiment.

FIG. 28 is a schematic diagram of the vehicle of the ninth embodiment. A vehicle 1200 of the ninth embodiment is an automobile. The vehicle 1200 includes a motor 140 and an inverter circuit 150.

The inverter circuit 150 includes three semiconductor modules each having the MOSFET 100 of the first embodiment as a switching element. By connecting the three semiconductor modules in parallel, the three-phase inverter circuit 150 including three AC voltage output terminals U, V, and W is implemented.

The motor 140 is driven by the AC voltage output from the inverter circuit 150. Wheels 90 of the vehicle 1200 are rotated by the motor 140.

According to the ninth embodiment, with the MOSFET 100 having improved properties, it is possible to improve the properties of the vehicle 1200.

Tenth Embodiment

An elevator of a tenth embodiment is an elevator including the semiconductor device of the first embodiment.

Figure 29:
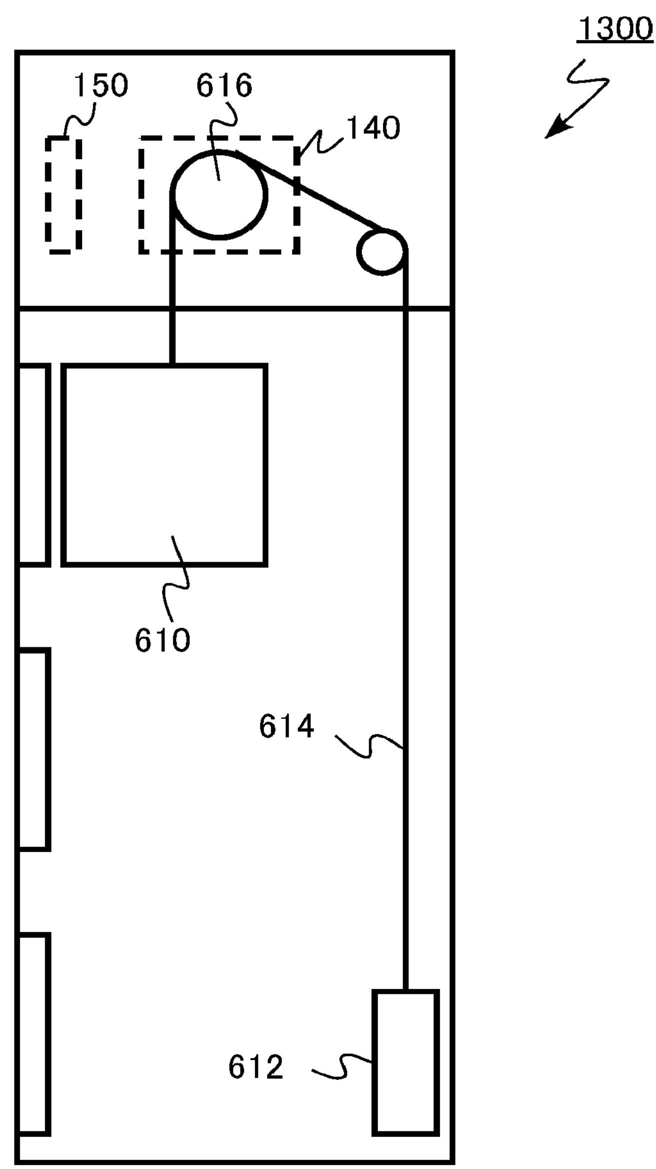
FIG. 29 is a schematic diagram illustrating an elevator of a tenth embodiment.

FIG. 29 is a schematic diagram of the elevator of the tenth embodiment. An elevator 1300 of the tenth embodiment includes a car 610, a counterweight 612, a wire rope 614, a hoist 616, a motor 140, and an inverter circuit 150.

The inverter circuit 150 includes three semiconductor modules each having the MOSFET 100 of the first embodiment as a switching element. By connecting the three semiconductor modules in parallel, the three-phase inverter circuit 150 including three AC voltage output terminals U, V, and W is implemented.

The motor 140 is driven by the AC voltage output from the inverter circuit 150. The hoist 616 is rotated by the motor 140, and the car 610 is moved up and down.

According to the tenth embodiment, with the MOSFET 100 having improved properties, it is possible to improve the properties of the elevator 1300.

As described above, in the first to sixth embodiments, while it has been described the case where a crystal structure of silicon carbide is 4H—SiC, the present disclosure is applicable to silicon carbide having a 6H—SiC, 3C—SiC, or other crystal structure.

In the seventh to tenth embodiments, the cases where the semiconductor device of the first embodiment is included have been described as examples. However, the semiconductor devices of the second to sixth embodiments are applicable.

In the seventh to tenth embodiments, the cases where the semiconductor device of the present disclosure is applied to vehicles and an elevator have been described as examples. However, the semiconductor device of the present disclosure is applicable to a power conditioner in a photovoltaic power system, or the like.

While certain embodiments have been described, these embodiments have been presented by way of example only, and are not intended to limit the scope of the inventions. Indeed, a semiconductor device, an inverter circuit, a drive device, a vehicle, and an elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:

a silicon carbide layer having a first plane and a second plane facing the first plane, and the silicon carbide layer including:

a first trench positioned on a first plane side;

a second trench positioned on the first plane side, the second trench having a first region and a second region;

a first silicon carbide region of n-type;

a second silicon carbide region of p-type positioned between the first silicon carbide region and the first plane;

a third silicon carbide region of n-type positioned between the second silicon carbide region and the first plane;

a fourth silicon carbide region of p-type positioned between the first trench and the first silicon carbide region, the fourth silicon carbide region having a p-type impurity concentration higher than a p-type impurity concentration of the second silicon carbide region; and a fifth silicon carbide region of p-type positioned between the second trench and the first silicon carbide region, the fifth silicon carbide region having a p-type impurity concentration higher than the p-type impurity concentration of the second silicon carbide region, and the fifth silicon carbide region having a first portion and a second portion that are each in direct physical contact with the first silicon carbide region, a gate electrode positioned in the first trench;

a gate insulating layer positioned between the gate electrode and the silicon carbide layer;

a first electrode positioned on the first plane side of the silicon carbide layer, a part of the first electrode being positioned in the second trench; and a second electrode positioned on a second plane side of the silicon carbide layer, wherein a first distance between the first trench and the first region is greater than a second distance between the first trench and the second region, the first portion is separated from the fourth silicon carbide region, and the second portion is in direct physical contact with the fourth silicon carbide region, and the first region is in contact with the first portion, and the second region is in contact with the second portion.

2. The semiconductor device according to claim 1, wherein the second distance is ⅓ or more and ⅔ or less of the first distance.

3. The semiconductor device according to claim 1, further comprising an interlayer insulating layer positioned between the gate electrode and the first electrode, a part of the interlayer insulating layer being positioned in the second region.

4. The semiconductor device according to claim 1, wherein a distance between the second plane and the first trench is greater than a distance between the second plane and the second trench in a direction vertical to the second plane.

5. The semiconductor device according to claim 1, wherein a distance between the second plane and the fourth silicon carbide region is greater than a distance between the second plane and the fifth silicon carbide region in a direction vertical to the second plane.

6. The semiconductor device according to claim 1, wherein a distance between the second plane and the first trench is less than a distance between the second plane and the second silicon carbide region in a direction vertical to the second plane, and a distance between the second plane and the second trench is less than the distance between the second plane and the second silicon carbide region in the direction vertical to the second plane.

7. The semiconductor device according to claim 1, wherein the first trench and the second trench extend on the first plane in a first direction parallel to the first plane.

8. The semiconductor device according to claim 7, wherein the first region and the second region are alternately positioned in the first direction.

9. The semiconductor device according to claim 7, wherein the first trench and the second trench are alternately positioned on the first plane in a second direction intersecting the first direction.

10. An inverter circuit comprising the semiconductor device according to claim 1.

11. A drive device comprising the semiconductor device according to claim 1.

12. A vehicle comprising the semiconductor device according to claim 1.

13. An elevator comprising the semiconductor device according to claim 1.

* * * * *